US008719737B1

(12) United States Patent
Wang

(10) Patent No.: US 8,719,737 B1
(45) Date of Patent: May 6, 2014

(54) METHOD AND APPARATUS FOR IDENTIFYING DOUBLE PATTERNING LOOP VIOLATIONS

(75) Inventor: Xiaojun Wang, Cary, NC (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 13/555,058

(22) Filed: Jul. 20, 2012

Related U.S. Application Data

(60) Provisional application No. 61/666,785, filed on Jun. 29, 2012.

(51) Int. Cl.
*G06F 17/50* (2006.01)

(52) U.S. Cl.
USPC .............. 716/52; 716/50; 716/51; 716/53; 716/54

(58) Field of Classification Search
USPC ........... 716/50, 51, 52, 53, 54, 110, 111, 119, 716/139
See application file for complete search history.

(56) References Cited

U.S. PATENT DOCUMENTS

| | | | | |
|---|---|---|---|---|
| 5,885,748 | A * | 3/1999 | Ohnuma | 430/296 |
| 6,782,524 | B2 * | 8/2004 | Rittman | 716/55 |
| 7,398,497 | B2 * | 7/2008 | Sato et al. | 716/112 |
| 8,176,445 | B1 * | 5/2012 | Qian | 716/52 |
| 8,209,656 | B1 | 6/2012 | Wang et al. | |
| 8,434,043 | B1 | 4/2013 | Hsu et al. | |
| 8,448,100 | B1 | 5/2013 | Lin et al. | |
| 8,516,402 | B1 * | 8/2013 | Wang | 716/52 |
| 2002/0152453 | A1 * | 10/2002 | Rittman | 716/21 |
| 2002/0166108 | A1 * | 11/2002 | Rittman | 716/19 |
| 2003/0115569 | A1 * | 6/2003 | Ikeuchi | 716/19 |
| 2005/0005256 | A1 * | 1/2005 | Rittman | 716/19 |
| 2005/0108665 | A1 * | 5/2005 | Neves et al. | 716/2 |
| 2009/0064083 | A1 * | 3/2009 | Ikeuchi | 716/19 |
| 2009/0291512 | A1 * | 11/2009 | Izuha et al. | 438/16 |
| 2009/0325085 | A1 * | 12/2009 | Yoshida et al. | 430/5 |
| 2010/0153905 | A1 | 6/2010 | Maeda | |
| 2010/0205573 | A1 * | 8/2010 | Busa et al. | 716/5 |
| 2010/0205575 | A1 * | 8/2010 | Arora et al. | 716/11 |
| 2011/0078638 | A1 | 3/2011 | Kahng et al. | |
| 2011/0078642 | A1 * | 3/2011 | Elfadel et al. | 716/106 |
| 2011/0088006 | A1 * | 4/2011 | Kojima et al. | 716/112 |
| 2011/0193234 | A1 | 8/2011 | Chen et al. | |
| 2011/0197168 | A1 * | 8/2011 | Chen et al. | 716/50 |
| 2011/0219341 | A1 * | 9/2011 | Cao et al. | 716/50 |
| 2011/0296360 | A1 | 12/2011 | Wang et al. | |
| 2012/0124536 | A1 * | 5/2012 | Sharma | 716/112 |
| 2012/0216157 | A1 * | 8/2012 | Luo et al. | 716/55 |
| 2013/0024822 | A1 * | 1/2013 | Hsieh et al. | 716/52 |
| 2013/0074018 | A1 * | 3/2013 | Hsu et al. | 716/55 |

OTHER PUBLICATIONS

U.S. Appl. No. 13/725,914, filed Dec. 21, 2012, Wang, Xiaojun.
Portions of presecution history of U.S. Appl. No. 13/725,914, Oct. 16, 2013, Wang, Xiaojun.
Portions of prosecution history of U.S. Appl. No. 12/251,455, May 18, 2012, Wang, Xiaojun, et al.

* cited by examiner

*Primary Examiner* — Nha Nguyen
*Assistant Examiner* — Brian Ngo
(74) *Attorney, Agent, or Firm* — Adeli LLP

(57) ABSTRACT

Some embodiments of the invention provide a method for automatically, accurately, and efficiently identifying double patterning (DP) loop violations in an IC design layout. The method of some embodiments identifies DP loop violations in a manner that eliminates false identification of DP loop violations without missing DP loop violations that should be identified. The method of some embodiments also generates a marker for each identified DP loop violation to indicate that a set of shapes associated with the marker forms the DP loop and displays the marker in the design layout.

19 Claims, 25 Drawing Sheets

METHOD AND APPARATUS FOR IDENTIFYING DOUBLE PATTERNING LOOP VIOLATIONS

CLAIM OF BENEFIT TO PRIOR APPLICATION

This present Application claims the benefit of U.S. Provisional Patent Application 61/666,785 filed Jun. 29, 2012. U.S. Provisional Patent Application 61/666,785 is incorporated herein by reference.

BACKGROUND

An integrated circuit ("IC") is a device (e.g., a semiconductor device) or electronic system that includes many electronic components, such as transistors, resistors, diodes, etc. These components are often interconnected to form multiple circuit components, such as gates, cells, memory units, arithmetic units, controllers, decoders, etc. An IC includes multiple layers of wiring that interconnect the IC's electronic and circuit components.

Design engineers design ICs by transforming logical or circuit descriptions of the ICs' components into geometric descriptions, called design layouts. Design layouts typically include (1) circuit modules (i.e., geometric representations of electronic or circuit IC components) with pins and (2) interconnect lines (i.e., geometric representations of wiring) that connect the pins of the circuit modules. In this fashion, design layouts often describe the behavioral, architectural, functional, and structural attributes of the IC. To create design layouts, design engineers typically use electronic design automation ("EDA") applications. These applications provide sets of computer-based tools for creating, editing, analyzing, and verifying design layouts. The applications also render the layouts on a display device or to storage for displaying later.

Fabrication foundries ("fabs") manufacture ICs based on the design layouts using a photolithographic process. Photolithography is an optical printing and fabrication process by which patterns on a photolithographic mask (i.e., "photomask," "mask," or "mask layer") are imaged and defined onto a photosensitive layer coating a substrate. To fabricate an IC, photomasks are created using the IC design layout as a template. The photomasks contain the various geometries or shapes (i.e., features) of the IC design layout. The various geometries or shapes contained on the photomasks correspond to the various base physical IC elements that comprise functional circuit components such as transistors, interconnect wiring, vertical interconnect access (via) pads, as well as other elements that are not functional circuit elements but are used to facilitate, enhance, or track various manufacturing processes. Through sequential use of the various photomasks corresponding to a given IC in an IC fabrication process, a large number of material layers of various shapes and thicknesses with various conductive and insulating properties may be built up to form the overall IC and the circuits within the IC design layout.

As more circuit features are packed into an IC design layout (e.g., manufacturing processes at feature sizes of 20 nm and below), the resolution of the photolithographic process makes it extremely difficult to fabricate the geometries or shapes on a single lithography mask. The difficulty stems from constraining factors in traditional photolithographic processes that limit the effectiveness of current photolithographic processes. Some such constraining factors are the lights/optics used within the photolithographic processing systems. Specifically, the lights/optics are band limited due to physical limitations (e.g., wavelength and aperture) of the photolithographic process. Therefore, the photolithographic process cannot print beyond a certain minimum width of a feature, minimum spacing between features, and other such physical manufacturing constraints.

For a particular layer of the IC fabrication process, the pitch specifies the sum of the width of a feature and the space on one side of the feature separating that feature from a neighboring feature on the same layer. The minimum pitch for a layer is the sum of the minimum feature width and the minimum spacing between features on the same layer. Depending on the photolithographic process at issue, factors such as optics and wavelengths of light or radiation restrict how small the pitch may be made before features can no longer be reliably printed to a wafer or mask. As such, the smallest size of any features that can be created on a layer of an IC is limited by the minimum pitch for the layer.

FIG. 1 illustrates a typical pitch constraint of a photolithographic process. In FIG. 1, a pitch 110 acts to constrain the spacing between printable features 120 and 130 of a design layout. While other photolithographic process factors such as the threshold 140 can be used to narrow the width 150 of the features 120 and 130, such adjustments do not result in increased feature density without adjustments to the pitch 110. As a result, increasing feature densities beyond a certain threshold is infeasible via a pitch constrained single exposure process.

To enhance the feature density, the shapes on a single layer can be manufactured on two different photolithographic masks. This approach is often referred to as "Double Patterning Lithography (DPL)" technology. FIG. 2 illustrates an example of this approach. In FIG. 2, a design layout 205 specifies three features 210-230 that are pitch constrained and therefore cannot be photo-lithographically printed with a conventional single exposure process. Analysis of the characteristics (e.g., the band limitation) of the available photolithographic process and of the design layout 205 results in the decomposition of the design layout 205 into a first exposure 240 for printing features 210 and 230 and a second exposure 250 for printing feature 220. As such, the features 210 and 230 are assigned to a first photomask for printing during the first exposure 240 and feature 220 is assigned to a second photomask for printing during the second exposure 250.

Some EDA tools model each shape in a design layout as a node in a graph to find conflicts in assigning the shapes to different masks. Two nodes are connected with a link (or a line, an edge, etc.) when the two corresponding shapes are within a threshold distance (e.g., a minimum pitch). The EDA tools also assign the shapes into different masks by assigning different colors to the nodes that represent the shapes. A node in a graph is assigned a color in such a way that the neighboring nodes have different colors. This is because when the neighboring nodes (e.g., a connected pair of nodes) have the same color, the corresponding shapes would violate a design rule (e.g., a pitch requirement). However, when the nodes in a graph form a loop and there are an odd number of nodes in such graph, it is not possible to assign different colors to all pairs of nodes of the graph. Such a loop is referred to as a double patterning (DP) loop or a DP loop violation in this application.

FIG. 3 illustrates a graph 305 that has three nodes that form a DP loop. The graph 305 represents shapes 1-3 in a layer of a design layout 300. This figure illustrates three different color assignments 301-303 to show that it is not possible to assign different colors to adjacent nodes in a graph that has an odd number of nodes forming a loop. Nodes 1-3 of the graph 305 represent the shapes 1-3, respectively. Two different colors, a first color and a second color, are assigned to the shapes 1-3. The first color is depicted as gray and the second color is white in this example. This figure also illustrates a minimum pitch 310 depicted as a horizontal line with two ends having vertical bars. As shown, shape 3 is depicted as three connected rectangles. These three rectangles are connected by design and treated as one shape in this example.

Each pair of shapes in the shapes 1-3 are within the minimum pitch 310. That is, the shapes 1 and 2 are within the minimum pitch; the shapes 1 and 3 are within the minimum pitch; and the shapes 2 and 3 are within the minimum pitch. Accordingly, the nodes 1-3 of the graph 305 are connected to each other, resulting in a loop. The three different colors assignments 301-303 show the three possible ways of assigning two different colors to the nodes 1-3 and the corresponding shapes 1-3. As shown, no matter how the color assignment is done, one pair of neighboring nodes has the same color. That is, there is always going to be a pair of shapes that would be violating the pitch requirement because the two corresponding nodes with the same assigned color are connected.

FIG. 4 illustrates an example printing error that is materialized on the physical wafer when the three shapes 1-3 illustrated in FIG. 3 that are assigned to two different masks get printed. Specifically, this figure shows a possible pattern 430 resulting from applying the color assignment 302 illustrated in FIG. 3. As shown, the shapes 1-3 are divided into two sets of shapes 410 and 415 according to the color assignment 302. That is, the shape 2 is sent to the first of the two masks and the shapes 1 and 3 are sent to the second mask.

Each set of shapes is printed during an exposure of a double exposure photolithographic printing process (e.g., a DPL process). That is, the shape set 410 (i.e., the shape 2) is printed during the first exposure in order to produce contours 420 and the shape set 415 is printed during the second exposure in order to produce contours 425. However, because the shape 1 and the shape 3 were too close (e.g., within the minimum pitch 310), the contour for the shape 1 and the contour for shape 2 intersect and result in a short in this example. The resulting union of the contours 420 and 425 generates the pattern 430. As shown, the pattern 430 did not meet the specifications within the original design layout represented by the pattern 405 in which shapes 1 and 3 are not meant to connect to each other.

In order to avoid printing errors at the fabs, the designers break DP loops in the design layouts before printing. Different designers use different design solutions to break DP loops. For instance, some design solutions break DP loops by moving one or both shapes of a pair of shapes in a DP loop away from each other so that the two shapes are not within the minimum pitch. Therefore, it is important to identify all DP loops existing in the design layouts. However, the existing approaches that identify DP loops often result in incorrectly or falsely identified DP loops or fail to identify DP loops that exist in the layouts.

BRIEF SUMMARY

Some embodiments of the invention provide a method for automatically, accurately, and efficiently identifying double patterning (DP) loop violations in an IC design layout. The method of some embodiments identifies DP loop violations in a manner that eliminates false identification of DP loop violations without missing DP loop violations that should be identified. The method of some embodiments also generates a marker for each identified DP loop violation to indicate that a set of shapes associated with the marker forms the DP loop and displays the marker in the design layout.

In some embodiments, the method first identifies one or more disjoint sets of shapes in the design layout. A disjoint set of shapes is a set of shapes in which one shape is within a threshold distance from at least one other shape. The method of some embodiments uses a graph in which the shapes are nodes or represented as the nodes. The method connects a pair of nodes with a link (e.g., a line or an edge) in the graph when the pair of shapes represented by the pair of nodes are within the threshold distance. In a graph representing a disjoint set, a node is connected to any other node by one or more links and nodes. A node is directly connected to another node when these two nodes are connected by a link.

For an identified disjoint set of shapes, the method determines whether the disjoint set includes a DP loop violation. The method of some embodiments uses a graph tracing technique to assign each shape in the disjoint set to one of the two masks used in double patterning by assigning one of the two different colors to the node that represents the shape in the disjoint set. In some such embodiments, the method uses a breadth first search to trace the graph representing the disjoint set in order to find a pair of directly connected nodes that are assigned to the same mask (i.e., that have the same assigned color).

In some embodiments, the method stops tracing the graph when one pair of directly connected nodes that are assigned to the same mask are found. When the method finds one such pair of nodes, the method of these embodiments does not locate the DP loop nor does the method find out whether there are more than one such pair of nodes exist in the disjoint set. That is, the method of these embodiments only determines the existence of a DP loop violation in the disjoint set. In this manner, the method quickly and efficiently filters out those disjoint sets that do not include a DP loop violation.

For each disjoint set that is determined to have at least one DP loop violation, the method of some embodiments uses geometric characteristics of the shapes in the disjoint set to identify one or more subsets of shapes in the disjoint set, where shapes in each of the subsets form a loop or fall (i.e., are located) within the loop. The shapes that do not form a loop or fall within a loop do not belong to any such subset.

For each such subset of the disjoint set, the method uses a graph tracing technique to determine if the loop formed by the shapes in the subset is a DP loop. In some embodiments, the method uses a breadth first search to trace the graph representing the subset. The method also identifies the shapes in the subset that form the DP loop and filters out the shape(s) that do not form the DP loop as the method traces the graph.

For the identified shapes of the subset that form the DP loop, the method generates a marker. In some embodiments, a marker for a DP loop includes information about the shapes that form the DP loop (e.g., coordinates of the vertices of the shapes) and/or shape of the marker (e.g., coordinates and/or type of shape as which the marker is to be displayed). The method of some embodiments displays the marker as a geometric shape that covers an area enclosed by the DP loop in the design layout.

In some embodiments, the method does not stop tracing the graph representing a disjoint set of shapes after the method finds one pair of directly connected nodes that are assigned to the same mask. The method of these embodiments continues to trace the graph and find all such pairs of directly connected nodes in the graph. The method of these embodiments then identifies subset(s) of shapes that form loops that each includes at least one of these pairs of directly connected nodes or fall within such loops. The method filters out (1) shapes that form loops but do not include any pair of directly connected nodes that are assigned to the same mask and (2) shapes that do not fall within such loops.

For each such subset in the disjoint set that remains to be considered, the method of some embodiments runs a graph tracing to determine whether the loop formed by the subset of the shapes is a DP loop. When it is determined that the loop formed by the subset of the shapes is a DP loop, the method of some embodiments generates a marker for a DP loop. The method of some embodiments displays the marker as a geometric shape that covers the area enclosed by the DP loop in the design layout.

The preceding Summary is intended to serve as a brief introduction to some embodiments of the invention. It is not meant to be an introduction or overview of all inventive subject matter disclosed in this document. The Detailed Description that follows and the Drawings that are referred to in the Detailed Description will further describe the embodiments described in the Summary as well as other embodiments. Accordingly, to understand all the embodiments described by this document, a full review of the Summary, Detailed Description and the Drawings is needed. Moreover, the claimed subject matters are not to be limited by the illustrative details in the Summary, Detailed Description and the Drawing, but rather are to be defined by the appended claims, because the claimed subject matters can be embodied in other specific forms without departing from the spirit of the subject matters.

DETAILED DESCRIPTION

In the following detailed description of the invention, numerous details, examples, and embodiments of the invention are set forth and described. However, it will be clear and apparent to one skilled in the art that the invention is not limited to the embodiments set forth and that the invention may be practiced without some of the specific details and examples discussed.

Some embodiments of the invention provide a method for automatically, accurately, and efficiently identifying DP loop violations in an IC design layout. The method of some embodiments identifies DP loop violations in a manner that eliminates false identification of DP loop violations without missing DP loop violations that should be identified. The method of some embodiments also generates a marker for each identified DP loop violation to indicate that a set of shapes associated with the marker forms the DP loop and displays the marker in the design layout. In some embodiments, the method displays the generated marker in the design layout that is displayed by an EDA application. The designer that uses the EDA application then can decide on a fix that breaks the DP loop.

Figure 1:
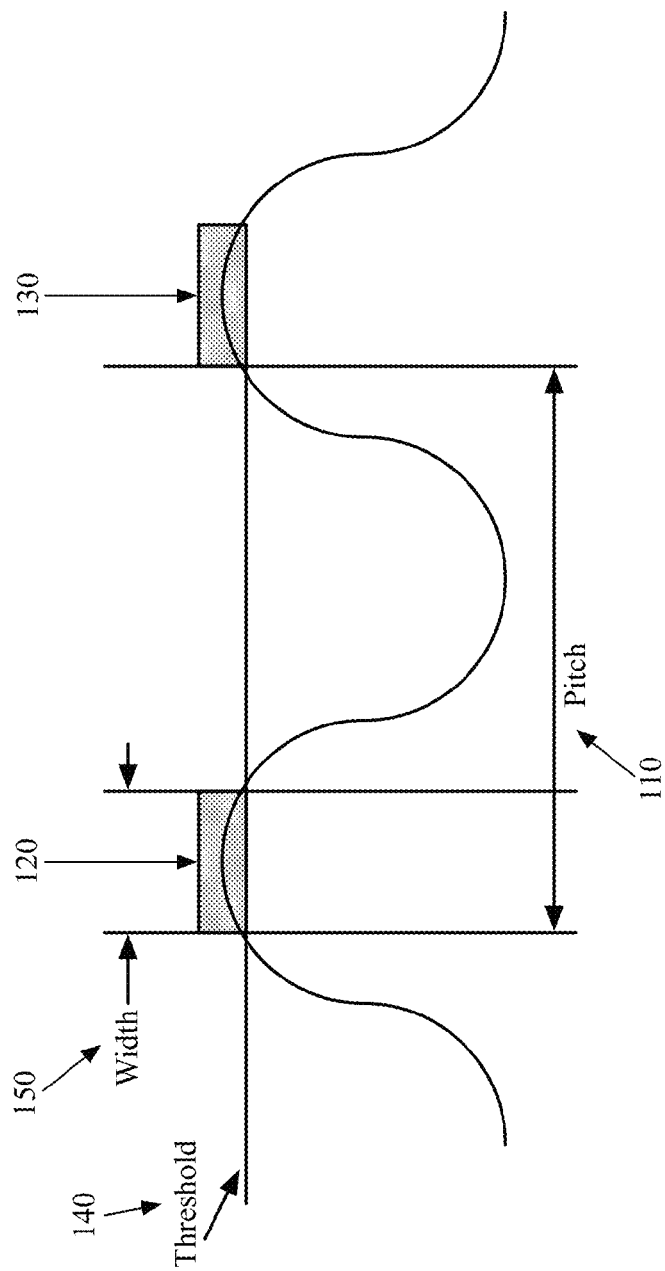
FIG. 1 illustrates a typical pitch constraint of a photolithographic process of some embodiments.
Figure 2:
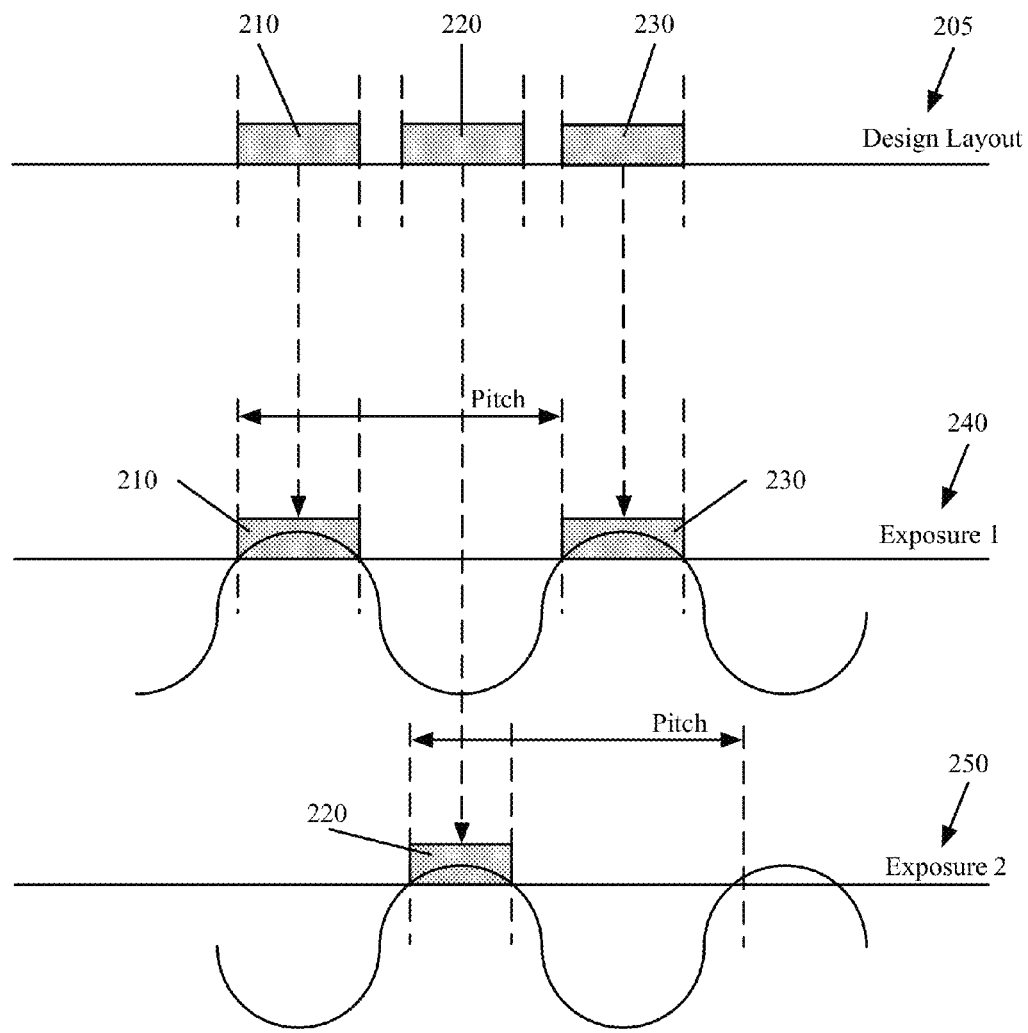
FIG. 2 illustrates an example of a multiple exposure photolithographic process of some embodiments.
Figure 3:
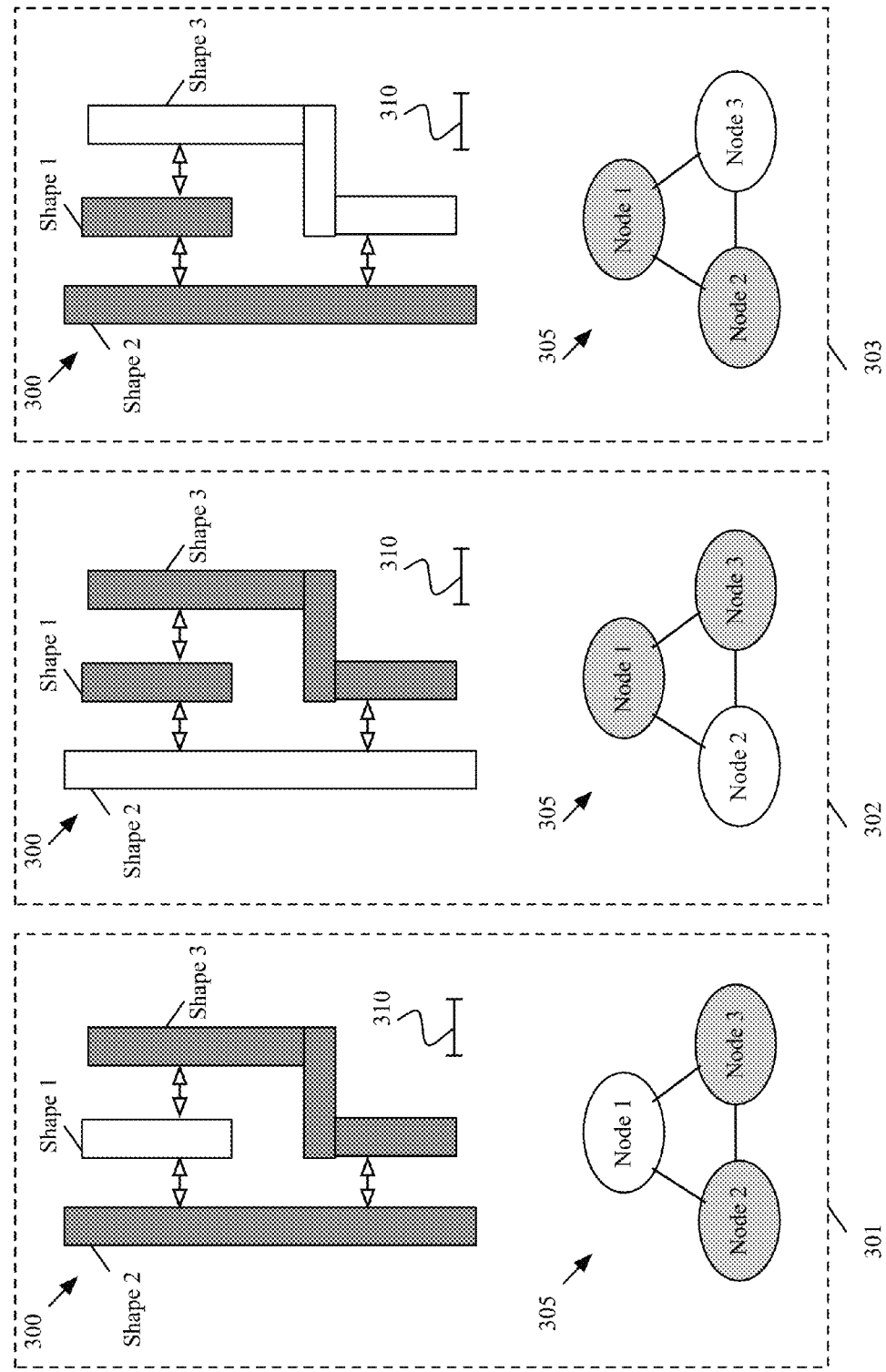
FIG. 3 illustrates a graph that has several nodes that are forming a double patterning (DP) loop.
Figure 4:
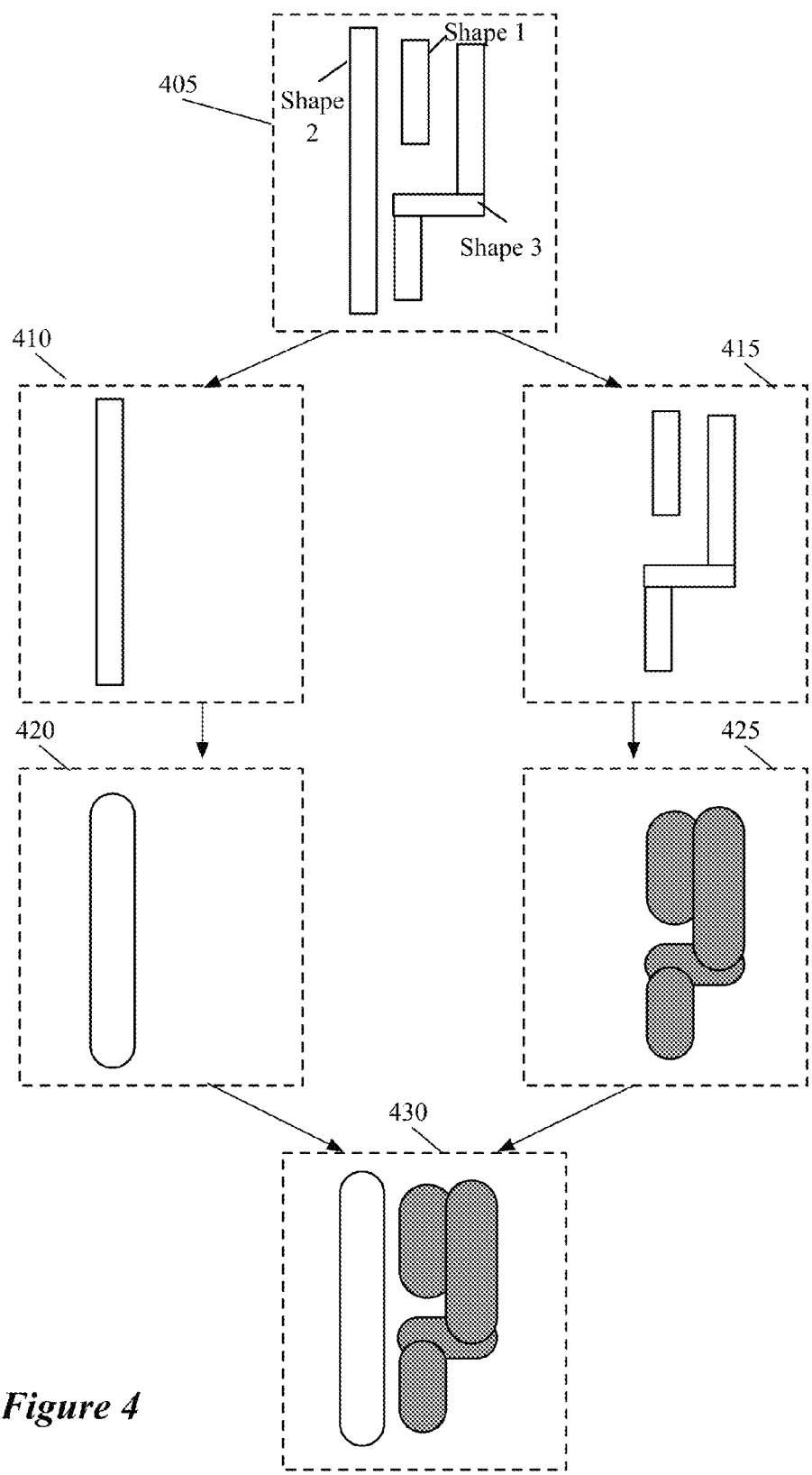
FIG. 4 illustrates an example printing error.
Figure 5:
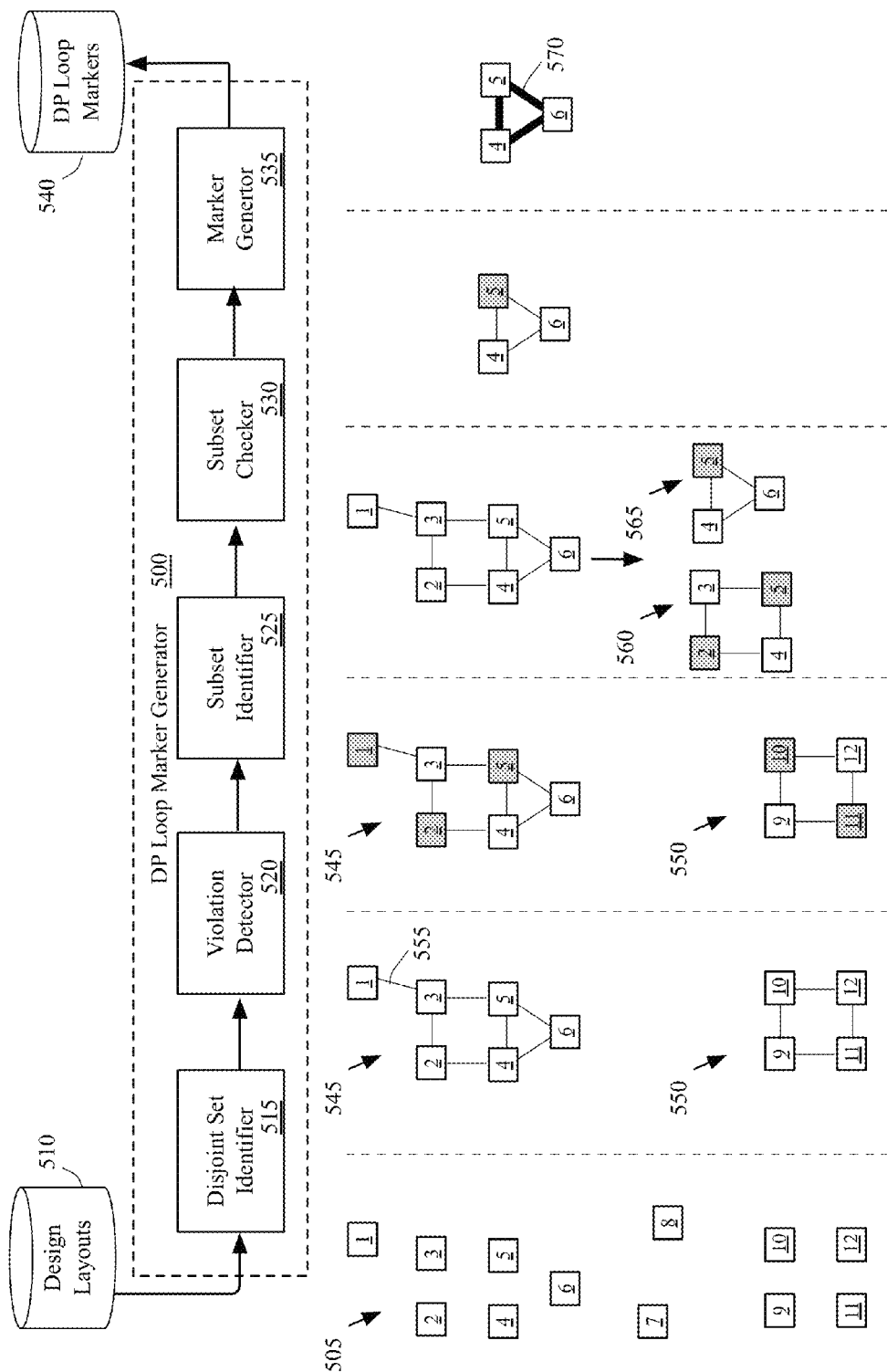
FIG. 5 conceptually illustrates a DP loop marker generator of some embodiments.

FIG. 5 conceptually illustrates a DP loop marker generator 500 of some embodiments. Specifically, FIG. 5 illustrates that the DP loop marker generator 500 accurately, efficiently, and automatically identifies a DP loop violation in a design layout 505. This figure also illustrates design layouts 510 and markers 540.

The design layouts 510 are generated by EDA applications, which circuit designers use to generate design layouts. As known in the art, design layout includes several design layers that represent an IC's multiple layers of wiring that interconnect the IC's electronic and circuit components. In some embodiments, the design layouts are in a database file format, e.g., GDS II stream format (GDSII).

The DP loop violation markers 540 are markers generated by the DP loop marker generator 500. In some embodiments, a marker for a DP loop includes information about the shapes that form the DP loop (e.g., coordinates of the vertices of the shapes and identifiers for the shapes, etc.). A marker in some embodiments is displayed as a geometric shape that covers the area enclosed by the DP loop in the design layout.

The DP loop marker generator 500 identifies all DP loop violations in a design layout and generates a DP loop marker for each identified DP loop violation. In some embodiments, the DP loop marker generator 500 is a stand-alone software application that is separate from an EDA application that generates the design layouts. In other embodiments, the DP loop marker generator 500 is part of the EDA application.

As shown, the DP loop marker generator 500 includes a disjoint set identifier 515, a violation detector 520, a subset identifier 525, a subset checker 530, and a marker generator 535. The disjoint set identifier 515 receives or retrieves a design layout and identifies all disjoint set of shapes in the design layout. A disjoint set of shapes is a set of shapes in which one shape is within a threshold distance from at least one other shape in the design layout. The disjoint set identifier 515 of some embodiments uses a graph in which the shapes are nodes or represented as the nodes. The disjoint set identifier 515 connects a pair of nodes with a link (e.g., a line or an edge) in the graph when the pair of shapes represented as the pair of nodes are within the threshold distance (e.g., a minimum pitch). In a graph representing a disjoint set, a node is connected to any other node by one or more links and nodes. A node is directly connected to another node when these two nodes are connected by a link.

The violation detector 520 examines each disjoint set of shapes in the design layout to detect existence of a DP loop in the disjoint set. Specifically, the violation detector 520 of some embodiments assigns each shape in the disjoint set to one of the two masks for double patterning process by assigning one of the two colors representing the two masks to the shape. The violation detector 520 detects the existence of a DP loop in the disjoint set by determining whether the disjoint set includes a pair of directly connected shapes that are assigned to the same mask.

In some embodiments, the violation detector 520 traces the graph to find such pair of shapes in the disjoint set using a graph tracing technique (e.g., a breadth first search). As the violation detector 520 traces the graph, the violation detector 520 assigns one of the two colors representing the two masks to each node in the graph for the disjoint set. The violation detector 520 assigns different colors to a pair of directly connected nodes. When the violation detector 520 finds a conflict in assigning colors to a pair of directly connected nodes (e.g., when the pair of nodes have the same assigned color), the violation detector 520 determines that the disjoint set includes a DP loop.

In some embodiments, the violation detector 520 stops tracing the graph as soon as a pair of nodes having the same assigned color is found. In other embodiments, the violation detector 520 continues to trace the graph until all nodes have assigned colors. In these embodiments, the violation detector 520 identifies all pairs of directly connected nodes that have the same assigned color.

The subset identifier 525 and the subset checker 530 functions differently based on what the violation detector 520 of different embodiments does. In those embodiments in which the violation detector 520 stops tracing the graph as soon as a pair of nodes having the same assigned color is found, the subset identifier 525 identifies one or more subsets of shapes in the disjoint set. Each of the subsets in these embodiments includes shapes that form a loop in the graph or falls within the loop. The subset identifier 525 thereby filters out any shapes that do not form loops or do not fall within the loops.

The subset checker 530 examines each of the identified subsets of shapes to determine whether the identified subset of shapes form a DP loop. In some embodiments, the subset checker 530 traces a subgraph (e.g., by using a breadth first search) that represents an identified subset of shapes. As the subset checker 530 traces the subgraph, the subset checker 530 assigns one of the two colors to each node of the subgraph. When the subset checker 530 finds a pair of directly connected nodes that have the same assigned color in the subgraph, the subset checker 530 determines that the subset of shapes represented by the subgraph includes a DP loop. The subset checker 530 also identifies the nodes that form the loop that includes the pair of shapes as the subset checker 530 traces the subgraph.

In those embodiments in which the violation detector 520 continues to trace the graph representing the disjoint set after finding a pair of directly connected nodes that have the same assigned color, the subset identifier 525 identifies subsets of shapes, where each subset includes shapes that (1) form a loop that includes at least one pair of directly connected nodes that have the same assigned color or (2) fall within such loop. The subset identifier 525 thereby filters out any shapes that do not form loops or fall in the loops and any shapes that form a loop that does not include such pair of nodes.

The subset checker 530 of these embodiments examines each of the identified subsets of shapes to determine whether the loop formed by the identified subset of shapes is a DP loop. In some of these embodiments, the subset checker 530 traces a subgraph (e.g., by using a breadth first search) that represents an identified subset of shapes. As the subset checker 530 traces the subgraph, the subset checker 530 reassigns a color to each node of the subgraph. When the subset checker 530 finds a pair of directly connected nodes that have the same assigned color in the subgraph, the subset checker 530 determines that the subset of shapes represented by the subgraph includes a DP loop.

For each subset of shapes that the subset checker 530 determines to have a DP loop, the marker generator 535 then generates a marker for the shapes of the subset that form the DP loop and stores the marker in the markers 540. Identifying shapes that form a DP loop will be described further below by reference to FIG. 8.

Figure 6:
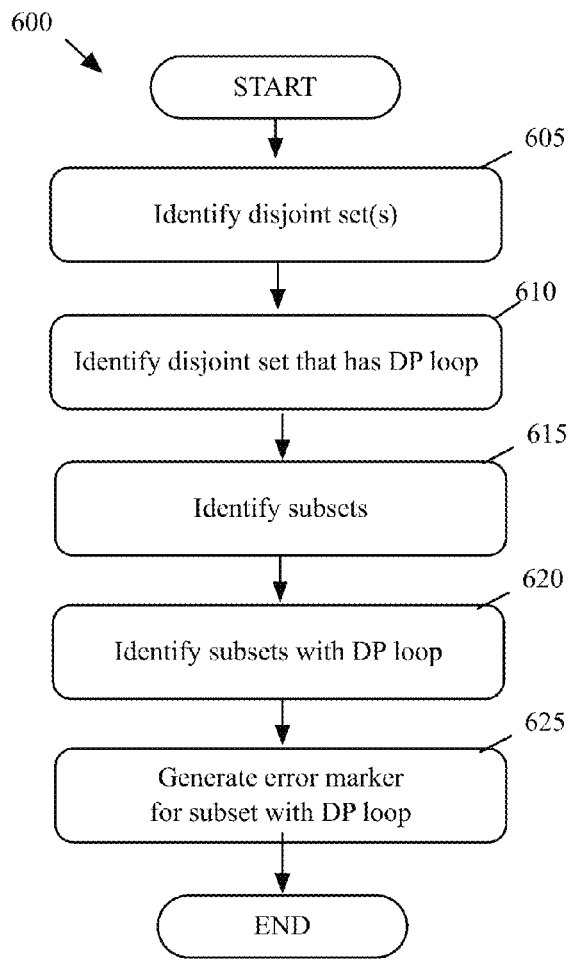
FIG. 6 conceptually illustrates a process that some embodiments perform to find DP loops in a design layout and generate markers for the DP loops.

An example operation of the DP loop marker generator 500 will now be described by reference to FIGS. 5 and 6. FIG. 6 conceptually illustrates a process 600 that some embodiments perform to accurately and efficiently find DP loops in a design layout and generate markers for the DP loops. In some embodiments, the process 600 is performed by the DP loop marker generator 500. The process 600 of some embodiments starts when the process 600 receives or retrieves a design layout.

The process 600 begins by identifying (at 605) a disjoint set of shapes in the design layout. FIG. 5 illustrates that the disjoint set identifier 515 receives the design layout 505 from the design layouts 510 and identifies two disjoint sets 545 and 550. As shown, the design layout 505 includes twelve shapes, shapes 1-12. The disjoint set identifier 515 connects each pair of shapes in the design layout 505 that are within a threshold distance (e.g., a minimum pitch) with a link 555. The disjoint set identifier 515 also filters out the shapes 7 and 8, each of which is not within the threshold distance from another shape. The disjoint set 545 includes shapes 1-6 and the disjoint set 550 includes shapes 9-12 as shown. Each of the shapes 1-6 and 9-12 is connected to at least one other shape.

Referring to FIG. 6, the process 600 next identifies (at 610) a disjoint set that includes a DP loop violation. FIG. 5 illustrates two connected graphs for the disjoint sets 545 and 550 that the violation detector 520 traces in order to determine whether the disjoint sets 545 and 550 include any DP loop violation. In this example, the violation detector 520 examines the disjoint set 545 first. The violation detector 520 selects shape 1 as a node from which to start tracing the graph for the disjoint set 545. In this example, the violation detector 520 utilizes a breadth first search to trace the graph. The violation detector 520 also assigns one of the two colors to each node of the graph as the violation detector 520 traces the graph.

In this example, the violation detector 520 assigns shape 1 to the first mask of the two masks for double patterning by assigning a first color (e.g., green) to the shape 1. Then, the violation detector 520 traces the graph and moves on to a directly connected node, shape 3. The violation detector 520 assigns shape 3 to the second mask of the two masks by assigning a second color (e.g., red) to the shape 3. The violation detector 520 moves on to shape 5 and then to shape 2 and alternates the color assignment such that a pair of directly connected nodes in the graph have different assigned colors.

As mentioned above, the violation detector 520 of some embodiments stops tracing the graph when the violation detector 520 identifies a pair of directly connected nodes in the graph have the same assigned colors. The violation detector 520 of other embodiments does not stop tracing the graph until all shapes in the graph have assigned colors. The violation detector 520 of these embodiments finds all pairs of directed connected nodes that have the same assigned color. In this example, the violation detector 520 happens to have to trace the graph representing the disjoint set 545 and color all shapes 1-6 in the disjoint set 545 to identify a pair of directly connected shapes that have the same assigned color (i.e., shapes 4 and 6).

The violation detector 520 also traces the graph representing the disjoint set 550 and assigns a color to each node of the graph, starting from node 10 in this example. The violation detector 520 moves on to shape 12, shape 9, and then shape 11. The violation detector 520 does not find a pair of directly connected shapes that have the same assigned color in the disjoint set 550.

Next, the process 600 identifies (at 615) one or more subsets of shapes in the disjoint set that is identified to have a DP loop. FIG. 5 illustrates that the subset identifier 525 identifies two subsets of shapes 560 and 565 that form a loop or fall in the loop. As shown, the subset 560 includes four shapes 2-5 that form a loop and the subset 565 includes three shapes 4-6 that form a loop. By identifying these subsets, the subset identifier 525 filters out shape 1 that does not form a loop or fall within the loop.

In those embodiments in which the violation detector 520 does not stop tracing the graph until all shapes in the graph have assigned colors, the subset identifier 525 identifies only those subsets of shapes that each includes at least a pair of directly connected nodes that have the same assigned color. In this example, the subset identifier 525 of these embodiments would identify only the subset of shapes 565 because the shapes 4-6 of the subset 565 form a loop that includes the pair of directly connected shapes (shapes 4 and 6) that have the same color assigned by the violation detector 520. The subset identifier 525 of these embodiments thereby filters out shapes 1-3 from the disjoint set 545. The subset identifier 525 would have also filtered out any shapes that fall within the loop formed by shapes 1-3.

The process 600 then identifies (at 620) a subset of shapes that includes a DP loop. FIG. 5 illustrates that the subset checker 530 examines the subsets 560 and 565. In those embodiments in which the violation detector 520 stops tracing the graph as soon as a pair of nodes having the same assigned color is found, the subset checker 530 traces each of the subgraphs that represent the subsets 560 and 565 in this example. As the subset checker 530 traces the subgraphs, the subset checker 530 also assigns colors to the nodes of the subgraphs. The subset checker 530 finds that the subset 565 includes a pair of directly connected shapes that have the same assigned color (i.e., shapes 4 and 6) and determines that the subset 565 includes a DP loop. In this example, the subset 565 does not include a shape that falls within the loop formed by the three shapes 4-6. The subset checker 530 would have filtered out such shape.

In those embodiments in which the violation detector 520 does not stop tracing the graph until all shapes in the graph have assigned colors, the subset checker 530 examines only the subset 565. The subset checker 530 traces the subgraph that represents the subset 565. As the subset checker 530 traces the subgraph, the subset checker 530 also assigns colors to the nodes of the subgraph. The subset checker 530 finds that the subset 565 includes a pair of directly connected shapes that have the same assigned color (i.e., shapes 4 and 6) and determines that the subset 565 includes a DP loop.

Next, the process 600 generates (at 625) a marker for each subset that includes a DP loop. FIG. 5 illustrates that the marker generator 535 generates a marker 570 for the DP loop formed by the three shapes 4-6. The process 600 then ends.

Figure 7:
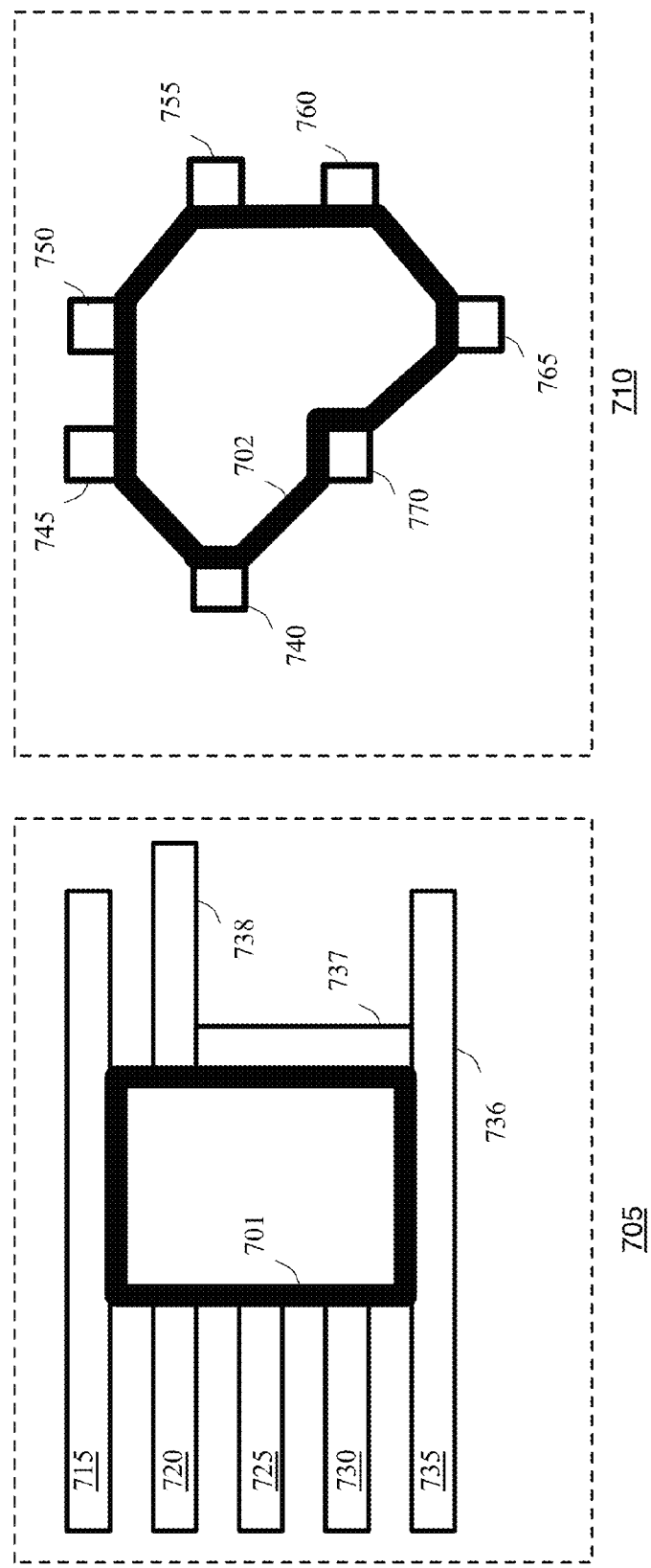
FIG. 7 illustrates two examples markers generated by the DP loop marker generator of some embodiments.

FIG. 7 illustrates two examples markers 701 and 702 generated by the DP loop marker generator (not shown) of some embodiments. As mentioned above, the markers give a visual cue to the circuit designers about DP loops formed by shapes in a design layout so that the designers can make a decision as to how to break up the DP loops. This figure illustrates two sets of shapes 705 and 710.

As shown, the set of shapes 705 includes five shapes 715-735. Shapes 715-730 are depicted as rectangles that represent wires. Shape 735 is depicted as three connected rectangles 736-738 that represent a single wire. In this example, shapes 715 and 720 are within a minimum pitch. Shapes 720 and 725 are within the minimum pitch. Shapes 725 and 730 are within the minimum pitch. Shapes 730 and 735 are within the minimum pitch. Shapes 735 and 715 are within the minimum pitch because the top portion depicted as the top rectangle 738 of shape 735 is within the minimum pitch from shape 715. The set of shape 705 therefore forms a DP loop because the five shapes 715-735 would form a loop with an odd number of nodes when the five shapes are represented as a graph (not shown).

The set of shapes 710 include seven shapes 740-770. These seven shapes are depicted as squares that represent vias. In this example, shapes 740 and 745 are within the minimum pitch. Shapes 745 and 750 are within the minimum pitch. Shapes 750 and 755 are within the minimum pitch. Shapes 755 and 760 are within the minimum pitch. Shapes 760 and 765 are within the minimum pitch. Shapes 765 and 770 are within the minimum pitch. Shapes 770 and 740 are within the minimum pitch. The set of shape 710 therefore forms a DP loop because the seven shapes 740-770 would form a loop with an odd number of nodes when the seven shapes are represented as a graph (not shown).

The DP loop marker generator would identify the sets of shapes 705 and 710 and generate a marker for each set. A marker would include the information about the shapes in the set (e.g., shape identifiers and/or coordinates of the vertices of the shape) and/or the information about the marker's shape and location in the design layout (e.g., coordinates and/or type of shape as which the marker is to be rendered).

Markers are displayed differently depending on how the DP loop marker generator or an EDA application (not shown) uses the information included in the markers to render the markers along the shapes forming the DP loops. For instance, a marker may be displayed as a geometric shape that encloses the area surrounded by the shapes that form the DP loop indicated by the marker. The entire geometric shape may be colored or only the border of the geometric shape may be colored. Different colors may be used and the borders may be rendered in different thicknesses. The marker 701 is displayed as a rectangle with a thick border. The marker 701 is touching the five shapes 715-735 in the example. The marker 702 is displayed as an irregular polygon with a thick border. The marker 702 also touches shapes 740-770 in the example.

Figure 8:
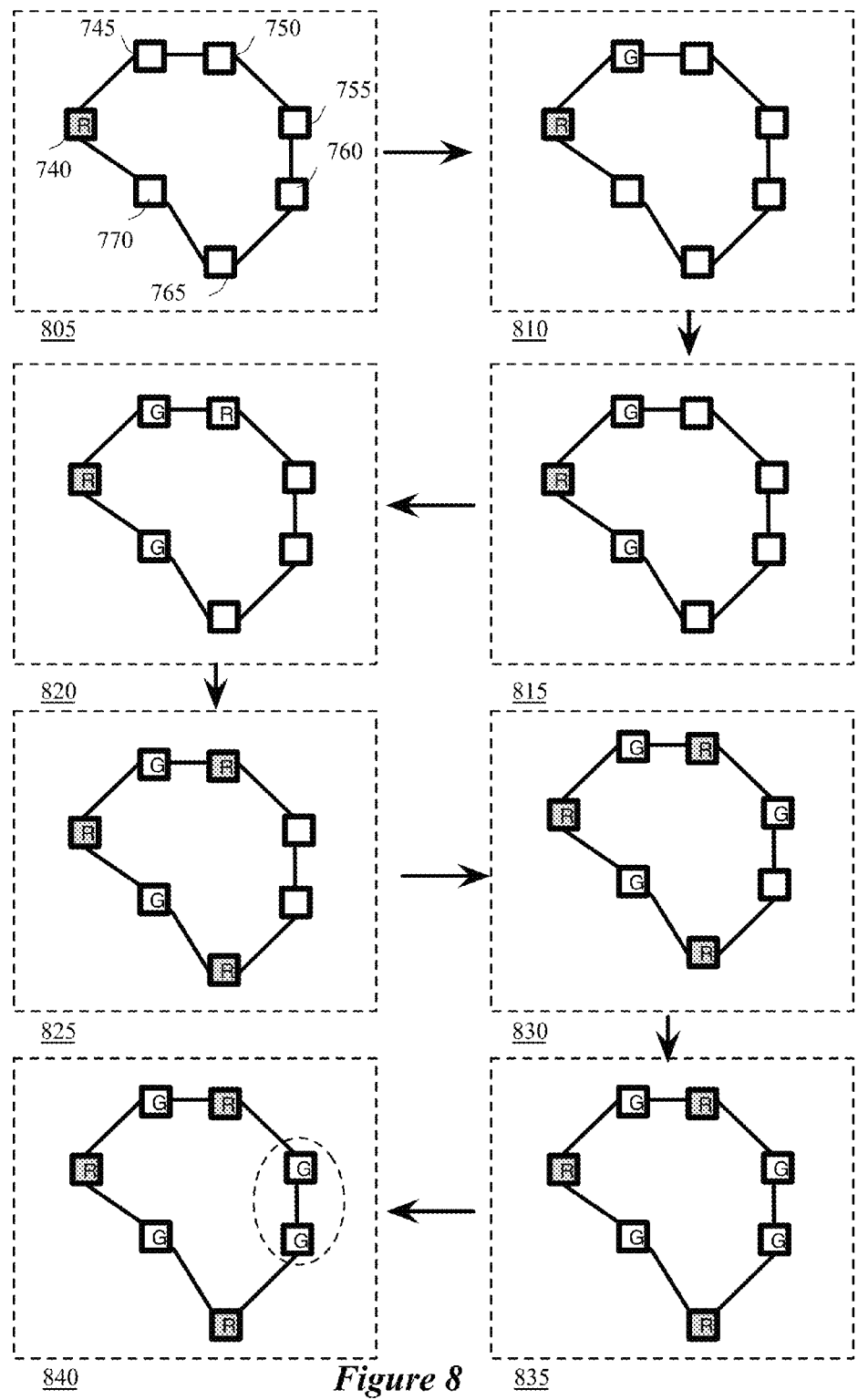
FIG. 8 illustrates an example of tracing a graph and assigning colors to the nodes of the graph using a breath first search.

FIG. 8 illustrates in terms of eight different stages 805-840 an example of tracing a graph and assigning colors to the nodes of the graph using a breath first search. FIG. 8 illustrates a graph 800 which connects the seven shapes 740-770 described above by reference to FIG. 7. A DP loop marker generator of different embodiments described above and below and the method of some embodiments that identifies DP loops and generates markers for the identified DP loops uses the breadth search to trace a graph.

A breadth first search of some embodiments begins at a root node and inspect all the neighboring nodes. Then, for each of those neighbor nodes in turn, some embodiments inspect their neighbor nodes which were unvisited, and so on. The nodes that are visited from a particular node are referred to as "child" nodes of the particular node. The particular node from which the child nodes are visited is referred to as "parent" node. The root node of a graph does not have a parent node and only has child node(s).

At the first stage 805, the DP loop marker generator (not shown) of some embodiments starts tracing the graph 800 from shape 740. That is, shape 740 is used as the root node for performing a breadth first search. The DP loop marker generator assigns a first color (e.g., red, depicted as grey) to shape 740. The DP loop marker generator of different embodiments selects a root node differently. For instance, the DP loop marker generator of some embodiments uses the leftmost node (e.g., a node having the smallest y-coordinate value) of the graph as the root node. The DP loop marker generator may also select a root node randomly.

Because shape 740 has two neighboring nodes 745 and 770, the DP loop marker generator moves on to these two shapes first. The nodes 745 and 770 are child nodes to the root node 740. In this example, the DP loop marker generator visits shape 745 first and assigns a second color (e.g., green, depicted as white) to shape 745 in order to avoid assigning the same color to the two neighboring nodes in the graph (e.g., shapes 740 and 745) as illustrated in the stage 810.

At stage 815, the DP loop marker generator then assigns the second color to shape 770. With the two neighboring nodes of shape 740 colored, the DP loop maker generator visits neighboring nodes of shape 745 that has not been visited (i.e., the DP loop marker generator visits the child nodes of shape 745). The DP loop marker generator therefore moves on to shape 750 because shape 750 is the only non-visited neighboring node of the shape 745. Shape 740, which is also a neighboring node of the shape 745 has been visited already. The DP loop marker generator assigns the first color to shape 750 in order to avoid assigning the same color to the pair of neighboring nodes 745 and 750 as illustrated in stage 820.

At stage 825, the DP loop marker generator then moves on to shape 765 because shape 770 is the next shape whose neighboring nodes are to be visited and shape 765 is the only non-visited neighboring nodes of shape 770 that has not been visited. The DP loop marker generator assigns the first color to shape 765 to avoid assigning the same color to the pair of neighboring nodes 770 and 765.

At stage 830, the DP loop marker generator moves on to shape 755 because shape 750 is the next shape whose neighboring nodes are to be visited and shape 755 is the only non-visited neighboring nodes of shape 750 that has not been visited. The DP loop marker generator assigns the second color to shape 755 to avoid assigning the same color to the pair of neighboring nodes 750 and 755.

At stage 835, the DP loop marker generator moves on to shape 760 because shape 765 is the next shape whose neighboring nodes are to be visited and shape 760 is the only non-visited neighboring nodes of shape 765 that has not been visited. The DP loop marker generator assigns the second color to shape 760 to avoid assigning the same color to the pair of neighboring nodes 765 and 760.

At stage 840, the DP loop marker generator attempts to visit shape 760 again because shape 755 is the next shape whose neighboring nodes are to be visited and shape 760 is one of the neighboring nodes of shape 755. The DP loop marker generator would assign a first color to shape 760 to avoid assigning the same color to the pair of neighboring nodes 755 and 760. However, the first color is already assigned to shape 760. The DP loop marker generator therefore determines that there is a color assignment conflict because two neighboring nodes have the same assigned color. Also, the DP loop marker generator also determines that a closed loop is formed by the nodes of the graph 800 because shape 760 is deemed already visited (i.e., having an assigned color) when shape 760 is one of the neighboring shapes to shape 755 that are to be visited.

The DP loop marker generator that uses the breadth first search as a graph tracing technique determines that shapes are forming a loop when a shape that is to be visited from one shape is already visited from another shape. That is, the DP loop marker generator determines that the shapes are forming a loop when the DP loop marker finds a child node that has two parents. The DP loop marker generator in some embodiments identifies the shapes forming the loop by tracing back to the root node from the child node that has two parents. In the example of FIG. 8, the DP loop marker generator traces the graph from shape 760 towards the root node 740 by following the parent node of each node. Because the shape 760 has two parent nodes 755 and 765, the DP loop marker of these embodiments will trace the graph (1) from 760 to shapes 765, 770, and 740, and (2) from 760, 755, 750, 745, and 740. By taking the union of these two sets of shapes, the DP loop marker would identify the shapes that form the loop. A person of ordinary skill will recognize that the trace does not have to start from the node that has two parent nodes. For instance, tracing back to the root node could start from shape 760 towards the root node and from shape 755 to the root node.

Several more detailed embodiments of the invention are described in the sections below. Section I provides a description of a method of some embodiments that automatically, accurately, and efficiently generates markers for DP loop. Next, Section II describes several use cases of some embodiments of the invention. Finally, Section III describes an electronic system that implements some embodiments of the invention.

I. Generating Markers for Design Layout

Some embodiments of the invention automatically, accurately, and efficiently find DP loops in a design layout. Before describing different embodiments of the invention in Subsection I.B., Subsection I.A. describes one of the conventional methods of finding DP loops in a design layout.

A. Conventional Technique

Figure 9:
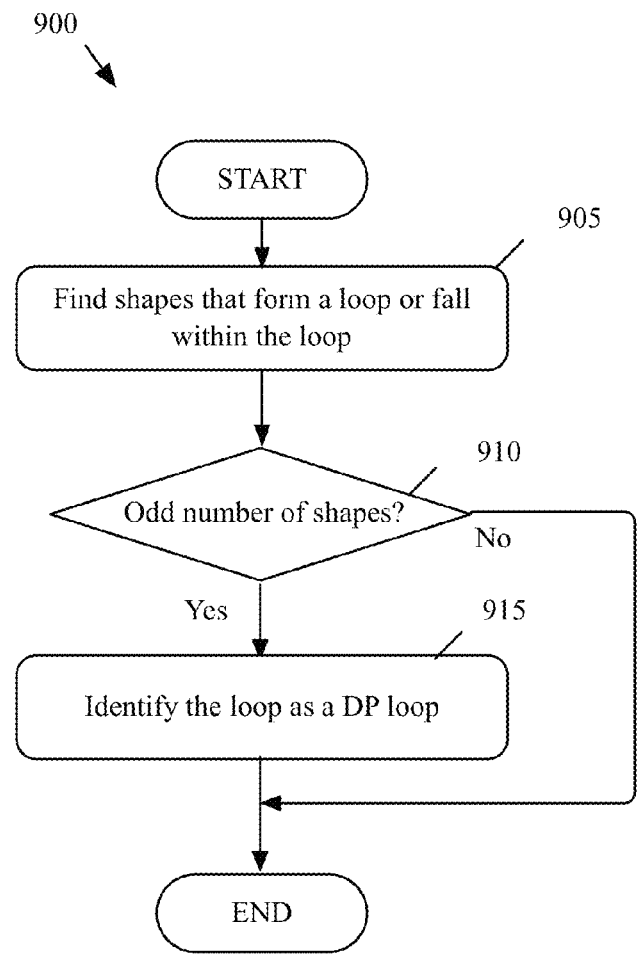
FIG. 9 conceptually illustrates a process that some embodiments perform to identify DP loops in a design layout.

FIG. 9 conceptually illustrates a process 900 that some embodiments perform to identify DP loops in a design layout. In some embodiments, the process 900 is performed by a conventional EDA application. The process 900 starts when the process 900 receives the design layout.

The process 900 begins by finding (at 905) shapes that form a loop or shapes that falls inside the loop in the design layout. In some embodiments, the process 900 uses a design rule check (DRC) command to find shapes that form the loop and shapes that fall within the loop in the design layout. In some cases, one DRC command is used to find the loop and another DRC command is used to find the shapes that fall within the loop. These DRC commands are available in a conventional EDA application. No further details about these DRC commands are described in this application for simplicity of description.

The process 900 then determines (at 910) whether the number of shapes that form the loop or fall in the loop is an odd number. When the process 900 determines (at 910) that the number of such shapes is an odd number, the process 900 generates (at 915) a marker to indicate that the loop is a DP loop. When the process 900 determines (at 910) that the number of such shapes is not an odd number, the process 900 does not generate a marker to indicate that the loop is a DP loop and the process 900 ends.

Figure 10:
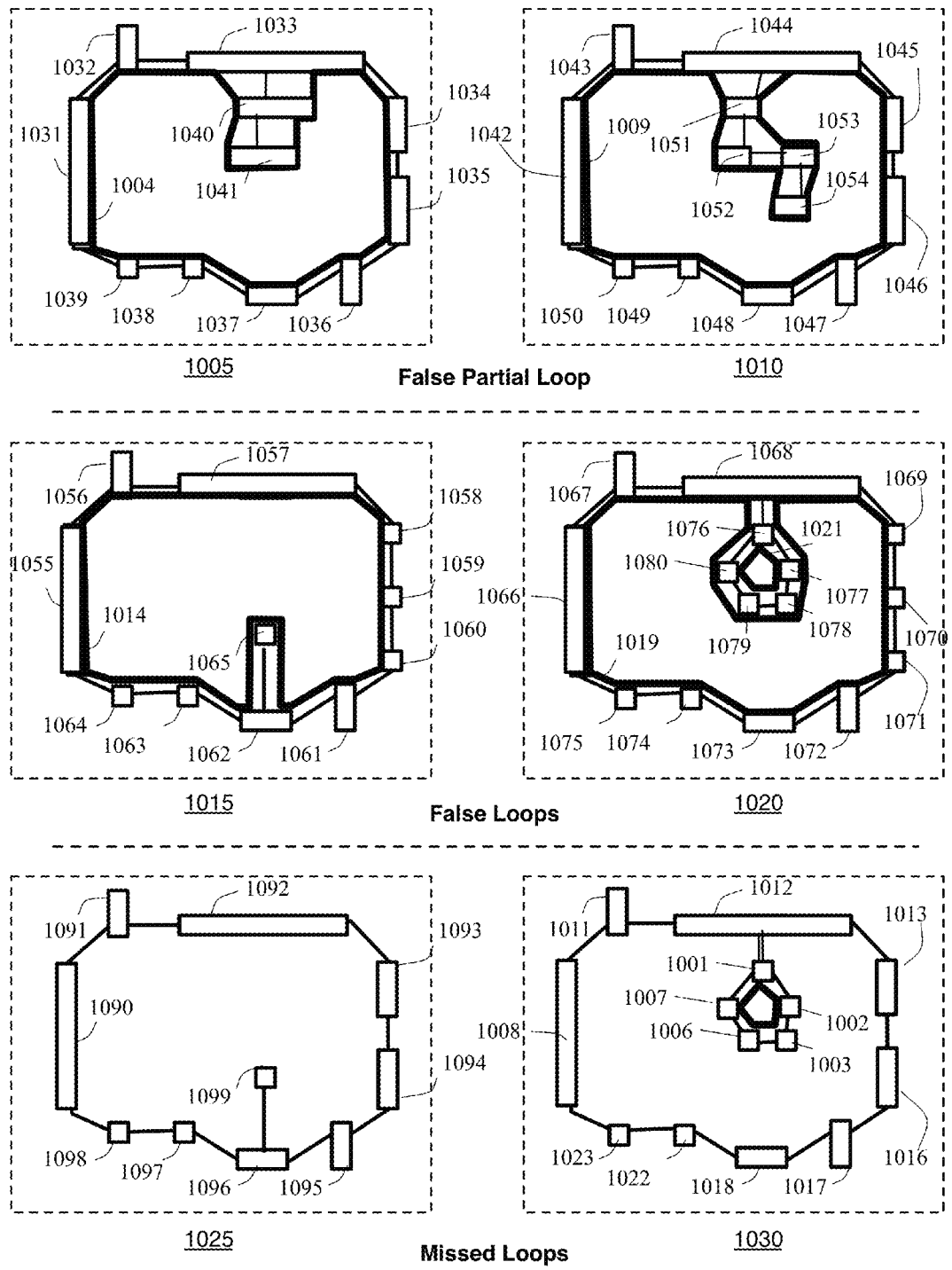
FIG. 10 illustrates several examples of such false positive identification and missed identifications.

The conventional technique for identifying DP loops in a design layout that performs the process 900 may result in false positive identification and missed identifications of DP loops. FIG. 10 illustrates several examples of such false positive identification and missed identifications. Specifically, this figure illustrates two examples 1005 and 1010 of a false partial DP loop, two examples 1015 and 1020 of a false DP loop, and two examples 1025 and 1030 of a missing DP loop.

A false partial DP loop includes shapes that form a DP loop as well as other shapes that do not form the DP loop. A conventional EDA application identifies a false partial DP loop as a DP loop and generates a marker for the false partial DP loop. The designers assume that breaking any link between a pair of shapes of the shapes that are associated with a marker should break the DP loop indicated by the marker. However, a marker generated for a false partial DP loop may mislead the designer because breaking the false partial DP loop does not necessarily result in breaking the true DP loop as illustrated by the examples 1005 and 1010.

In the example 1005, the conventional EDA application generates a marker 1004 that encloses an area surrounded by eleven shapes 1031-1041. The conventional EDA application identifies these eleven shapes 1031-1041 as forming a DP loop because (1) the nine shapes 1031-1039 form a loop and the two shapes 1040 and 1033 fall within the loop and (2) shapes 1031-1041 count to an odd number, eleven. However, the actual DP loop is formed only by the nine shapes 1031-1039. Therefore, the marker 1004 may mislead the designers (or an EDA application that automatically generates a design solution based on the marker) because breaking any link (depicted as a line connecting two shapes) between a pair of shapes in the eleven shapes 1031-1041 does not necessarily break the actual DP loop. For instance, breaking the link that connects shapes 1033 and 1040 or the link that connects shapes 1040 and 1041 does not break the actual DP loop formed by the shapes 1031-1039.

In the example 1010, the conventional EDA application generates a marker 1009 that encloses an area surrounded by thirteen shapes 1042-1054. The conventional EDA application identifies these thirteen shapes 1042-1054 as forming a DP loop because (1) the nine shapes 1042-1050 form a loop and the four shapes 1051-1054 fall within the loop and (2) shapes 1042-1054 count to an odd number, thirteen. However, the actual DP loop is formed only by the nine shapes 1042-1050. Therefore, the marker 1009 may mislead the designers (or an EDA application that automatically generates a design solution based on the marker) because breaking any link between a pair of shapes in the thirteen shapes 1031-1041 does not necessarily break the actual DP loop. For instance, breaking the link that connects shapes 1044 and 1051, the link that connects shapes 1051 and 1052, the link that connects shapes 1052 and 1053, or the link that connects shapes 1053 and 1054 does not break the actual DP loop formed by the shapes 1042-1050.

A false DP loop includes shapes that form a loop that is not a DP loop. That is, a false DP loop is a loop falsely identified as a DP loop. A conventional EDA application identifies a false DP loop as a DP loop and generates a marker for the false DP loop. A marker generated for a false DP loop may cause the designers or the EDA applications that use the marker to make unnecessary changes to the design layout.

In the example 1015, the conventional EDA application generates a marker 1014 that encloses an area surrounded by eleven shapes 1055-1065. The conventional EDA application identifies these eleven shapes 1055-1065 as forming a DP loop because (1) the ten shapes 1055-1064 form a loop and shape 1065 fall within the loop and (2) shapes 1055-1064 count to an odd number, eleven. However, the shapes 1055-1065 do not form a DP loop. The loop formed by the ten shapes 1055-1064 is not a DP loop because an even number (i.e., ten) of shapes is forming a loop and thus all ten shapes can be assigned to two different masks without assigning any pair of shapes that are within the minimum pitch to the same mask. Therefore, the marker 1014 misleads the designers (or an EDA application that automatically generates a design solution based on the marker) to make unnecessary change to the design layout. Breaking any link between any pair of shapes of the eleven shapes 1055-1065 is unnecessary because all of the eleven shapes 1055-1065 can be assigned to two different masks without assigning any pair of shapes that are within the minimum pitch to the same mask.

In the example 1020, the conventional EDA application generates two markers 1019 and 1021. The marker 1019 encloses an area surrounded by fifteen shapes 1066-1075-1080. The marker 1021 encloses an area surrounded by five shapes 1076-1080. The conventional EDA application identifies the fifteen shapes 1066-1080 as forming a DP loop because (1) the ten shapes 1066-1075 form a loop and the five shapes 1076-1080 fall within the loop and (2) shapes 1066-1080 count to an odd number, fifteen. However, the shapes 1066-1080 together do not form a DP loop. Only the five shapes 1076-1080 form a DP loop. The outer loop formed by the ten shapes 1066-1075 is not part of a DP loop because all ten shapes can be assigned to two different masks without assigning any pair of shapes that are within the minimum pitch to the same mask. Therefore, the marker 1019 may mislead the designers (or an EDA application that automatically generates a design solution based on the marker) to make unnecessary change to the design layout. Breaking any link between any pair of shapes of the 10 shapes 1066-1075 or the link between shapes 1068 and 1076 is unnecessary because all of the eleven shapes 1066-1076 can be assigned to two different masks without assigning any pair of shapes that are within the minimum pitch to the same mask. The marker 1021 is correctly identifying a DP loop formed by the five shapes 1076-1080.

A conventional EDA application in some cases fails to identify DP loops. In the example 1025, the conventional EDA application does not generate any marker for a DP loop formed by nine shapes 1090-1098 because (1) the nine shapes 1090-1098 form a loop and shape 1099 fall within the loop and (2) shapes 1090-1098 count to an even number, ten. Therefore, a marker that should have been generated for the DP loop formed by the nine shapes 1090-1098 is missing. The design layout will be sent to fabs without breaking this DP loop and may cause one or more printing errors.

In the example 1030, the conventional EDA application generates a marker 1029 for a DP loop formed by five shapes 1001-1003 and 1006-1007. The conventional EDA application does not generate a marker for a DP loop formed by nine shapes 1008, 1011-1013, 1016-1018, and 1022-1023 because (1) the nine shapes 1008, 1011-1013, 1016-1018, and 1022-1023 form a loop and the five shapes 1001-1003 and 1006-1007 fall within the loop and (2) shapes 1001-1003, 1006-1008, 1011-1013, 1016-1018, and 1022-1023 count to an even number, fourteen. Therefore, a marker that should have been generated for the DP loop formed by the nine shapes 1008, 1011-1013, 1016-1018, and 1022-1023 is missing. The design layout will be sent to fabs without breaking this DP loop and may cause one or more printing errors.

B. Automatic, Accurate and Efficient Technique for Identifying DP Loops

Figure 11:
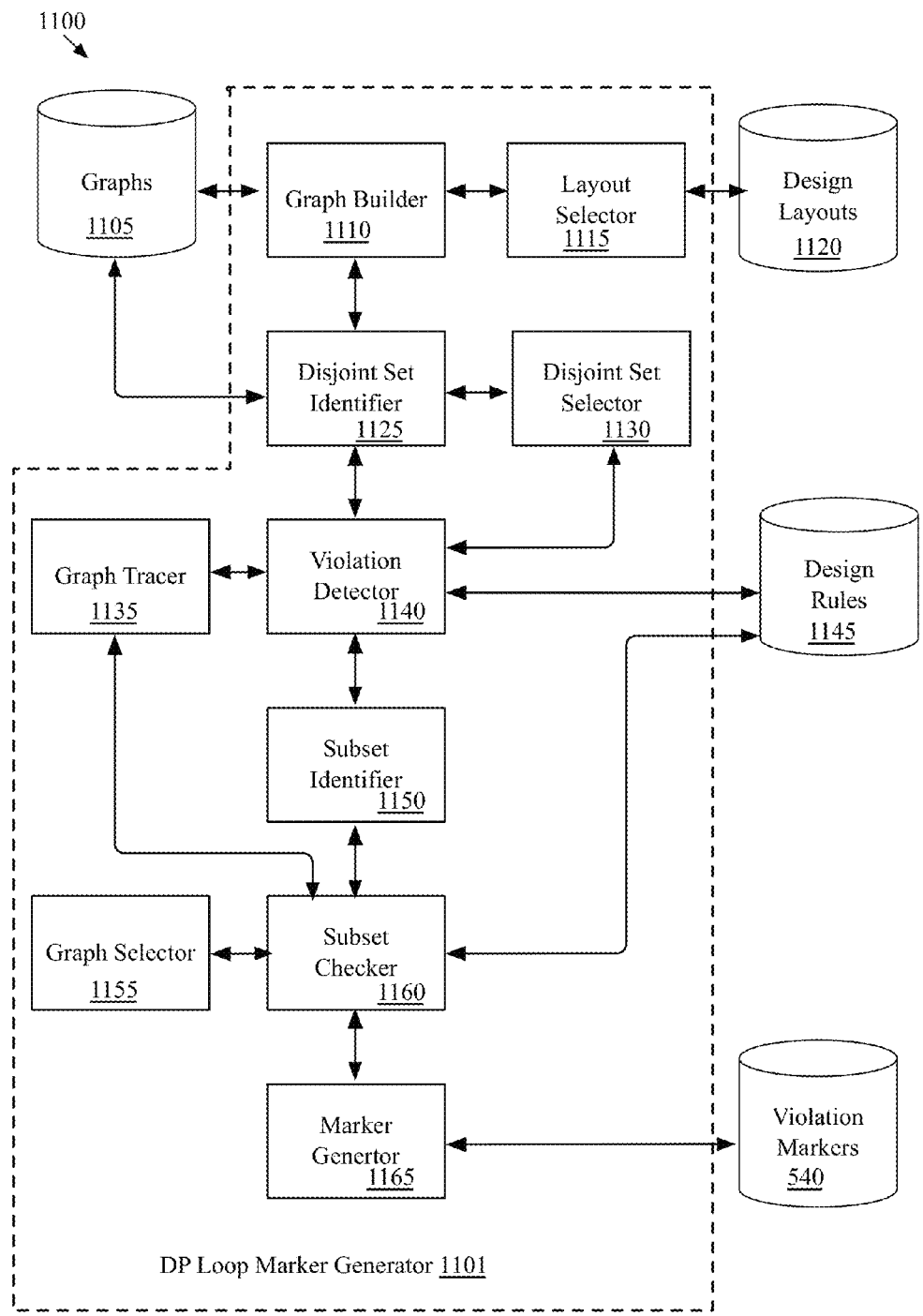
FIG. 11 conceptually illustrates architecture for a DP loop marker generator of some embodiments.

FIG. 11 conceptually illustrates 1100 architecture for a DP loop marker generator 1101 of some embodiments. Specifically, FIG. 11 illustrates that the DP loop marker generator 1101 automatically, accurately, and efficiently identifies DP loop violations in design layouts. As shown, the DP loop marker generator 1101 includes a layout selector 1115, a graph builder 1110, a disjoint set identifier 1125, a disjoint set selector 1130, a graph tracer 1135, a violation detector 1140, a subset identifier 1150, a graph selector 1155, a subset checker 1160, and a marker generator 1165. This figure also illustrates the design layouts 1120, graphs 1105, design rules 1145, and markers 1170.

The layout selector 1115 receives or retrieves a design layout from the design layouts 510. The layout selector selects the design layout based on an input received through a user interface (not shown) from a user of the DP loop marker generator 1101 in some embodiments.

The graph builder 1110 builds graphs for the selected design layout. The graph builder 1110 of some embodiments connects with a link any pair of shapes in the design layout that are within a minimum pitch. The graph builder 1110 looks up the design rules 1145 to find out the value of the minimum pitch. The design rules 1145 includes a set of design rules that the shapes in the design layout have to follow. For instance, the set of design rules include the minimum pitch.

The disjoint set identifier 1125 is similar to the disjoint set identifier 515 described above by reference to FIG. 5. The disjoint set identifier 1125 of some embodiments identifies sets of shapes that are connected in the graphs as disjoint sets. The disjoint set identifier 1125 thereby filters out all the shapes that are not connected.

The disjoint set selector 1130 selects a disjoint set of shapes. In some embodiments, the disjoint set selector 1130 selects one of the identified disjoint sets in the design layout based on a user input or based on a request from the violation detector 1140.

The violation detector 1140 is similar to the violation detector 520 described above by reference to FIG. 5. The violation detector 1140 examines a selected disjoint set to detect existence of a DP loop in the selected disjoint set. In some embodiments, the violation detector 1140 traces the graph representing the disjoint set using the graph tracer 1135 to find a pair of directly connected shapes in the disjoint set. The graph tracer 1135 uses a graph tracing technique (e.g., a breadth first search). The graph tracer 1135 also assigns one of the two colors representing the two masks to each shape in the graph for the disjoint set. The graph tracer 1135 assigns different colors to a pair of directly connected nodes. When the violation detector 1140 finds a conflict in assigning colors to a pair of directly connected shapes (e.g., when the pair of shapes have the same assigned color), the violation detector 520 determines that the disjoint set includes a DP loop. The violation detector 1140 of some embodiments looks up the design rules 1145 to find out that a pair of directly connected shapes should not have the same assigned color.

In some embodiments, the violation detector 1140 stops tracing the graph as soon as a pair of shapes having the same assigned color is found. In other embodiments, the violation detector 1140 continues to trace the graph until all shapes of the disjoint set have assigned colors. In these embodiments, the violation detector 1140 identifies all pairs of directly connected shapes that have the same assigned color.

The subset identifier 1150 and the subset checker 1160 are similar to the subset identifier 525 and the subset checker 530, respectively, that are described above by reference to FIG. 5. The subset identifier 1150 and the subset checker 1160 functions differently based on what the violation detector 1140 of different embodiments does. In those embodiments in which the violation detector 1140 stops tracing the graph as soon as a pair of shapes having the same assigned color is found, the subset identifier 1150 identifies one or more subsets of shapes in the disjoint set. Each of the subsets in these embodiments includes shapes that form a loop or falls within the loop. The subset identifier 1150 thereby filters out any shapes that do not form loops or do not fall within the loops.

The subset checker 1160 examines each of the identified subsets of shapes in the disjoint set to determine whether the identified subset of shapes form a DP loop. The subset checker 1160 of some embodiments uses the graph selector 1155 to select a subgraph representing an identified subset of shapes. In some embodiments, the subset checker 1160 traces a subgraph that represents an identified subset of shapes using the graph tracer 1135. As the graph tracer 1135 traces the subgraph, the graph tracer 1135 assigns one of the two colors to each node of the subgraph. When the subset checker 1160 finds a pair of directly connected shapes that have the same assigned color in the subgraph, the subset checker 1160 determines that the subset of shapes represented by the subgraph includes a DP loop. Specifically, the subset checker 1160 of some embodiments identifies the shapes that form a loop that includes the pair of shapes as the subset checker 1160 traces the subgraph. The subset checker 1160 filters out shapes in the subset that do not form the loop. The subset checker 1160 identifies this loop as a DP loop.

In those embodiments in which the violation detector 1140 continues to trace the graph representing the disjoint set after finding a pair of directly connected shapes that have the same assigned color, the subset identifier 1150 identifies all subsets of shapes that each forms a loop and includes at least one pair of directly connected shapes that have the same assigned color. The subset identifier 1150 of these embodiments thereby filters out (1) any shapes in the subset that do not form loops and (2) any shapes in the subset that form a loop that does not include such pair of shapes. In some embodiments, the subset identifier 1150 uses one or more DRC commands to find shapes that form a loop and shapes that fall within the loop in the disjoint set of shapes.

The subset checker 1160 of these embodiments examines each of the identified subsets of shapes to determine whether the loop formed by the identified subset of shapes is a DP loop. In some of these embodiments, the subset checker 530 counts the number of shapes in the identified subset. When the number of shapes in the identified subset is an odd number, the subset checker 1160 determines that the identified subset of shapes forms a DP loop. When the number of shapes in the identified subset is an even number, the subset checker determines that the identified subset of shapes do not form a DP loop. Alternatively or conjunctively, the subset checker 1160 may trace a subgraph that represents an identified subset of shapes using the graph tracer 1135. As the graph tracer 1135 traces the subgraph, the graph tracer 1135 reassigns a color to each node of the subgraph. When the subset checker 1160 finds a pair of directly connected nodes that have the same reassigned color in the subgraph, the subset checker 1160 determines that the subset of shapes represented by the subgraph includes a DP loop.

For each subset of shapes that the subset checker 1160 determines to have a DP loop, the marker generator 1165, which is similar to the marker generator 535, then generates a marker for the shapes of the subset that form the DP loop and stores the marker in the markers 540. The shapes of the subset are identified by tracing the graph towards the root node of the graph from the pair of directly connected nodes that have the same assigned color.

In some embodiments, the DP loop marker generator 1101 is a stand-alone software application that is separate from an EDA application that generates the design layouts. In other embodiments, the DP loop marker generator 1101 is part of the EDA application that may also generate design solutions to fix DP loop violations based on the generated markers.

Figure 12:
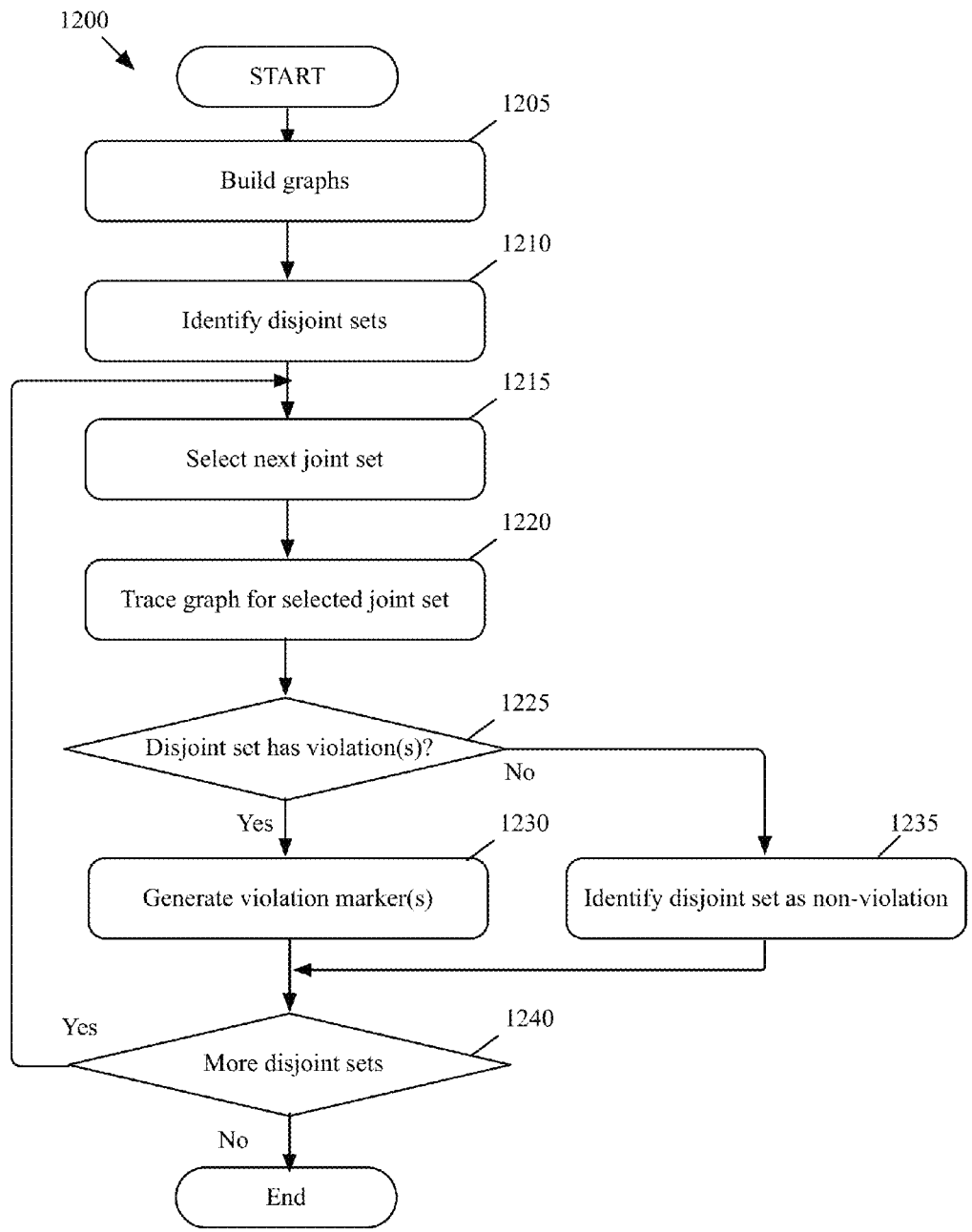
FIG. 12 conceptually illustrates a process that some embodiments perform to find DP loops in a design layout and generate markers for the DP loops found.
Figure 13:
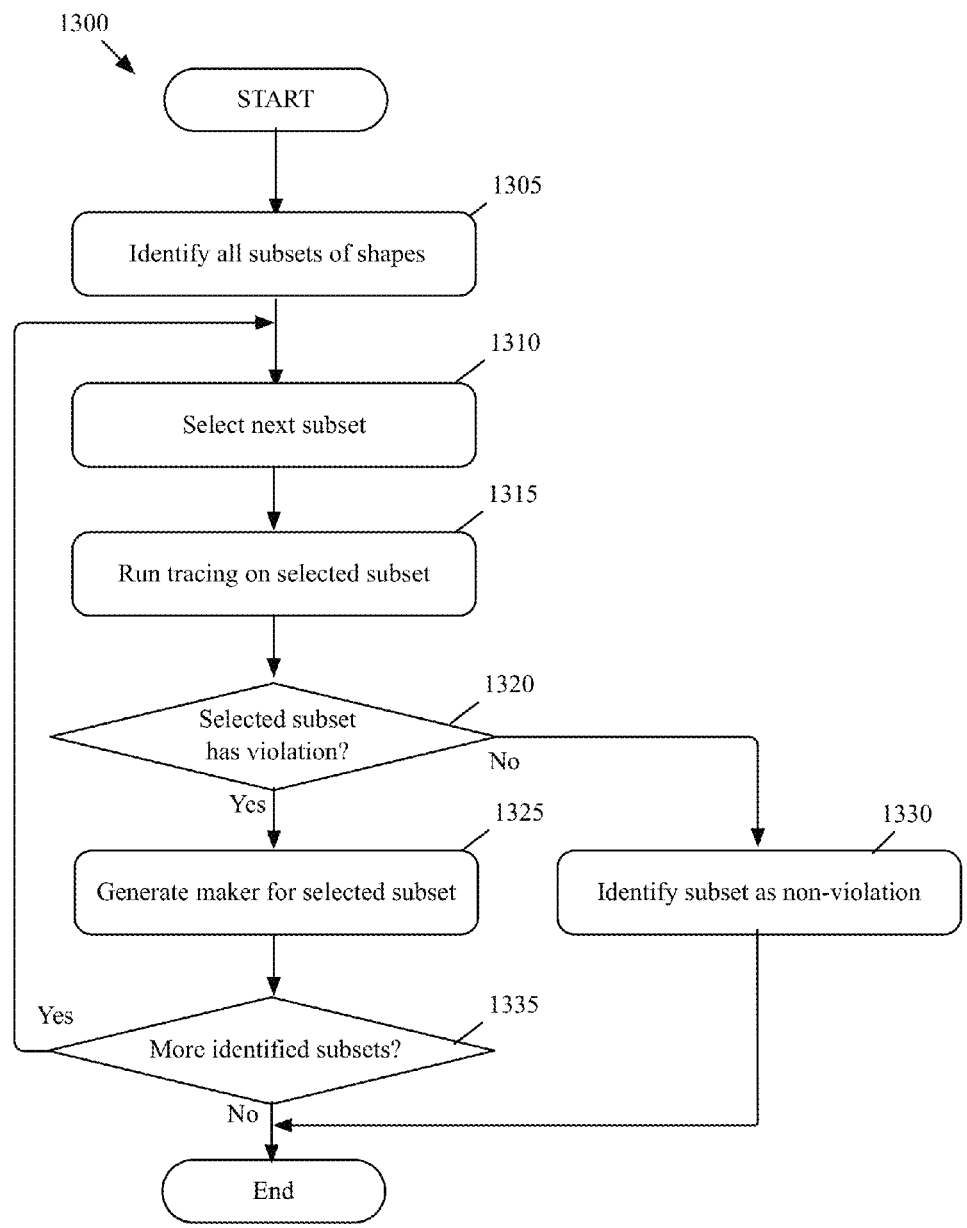
FIG. 13 conceptually illustrates a process that some embodiments perform to find DP loops in a design layout and generate markers for the DP loops found.
Figures 14, 14A, 14B:
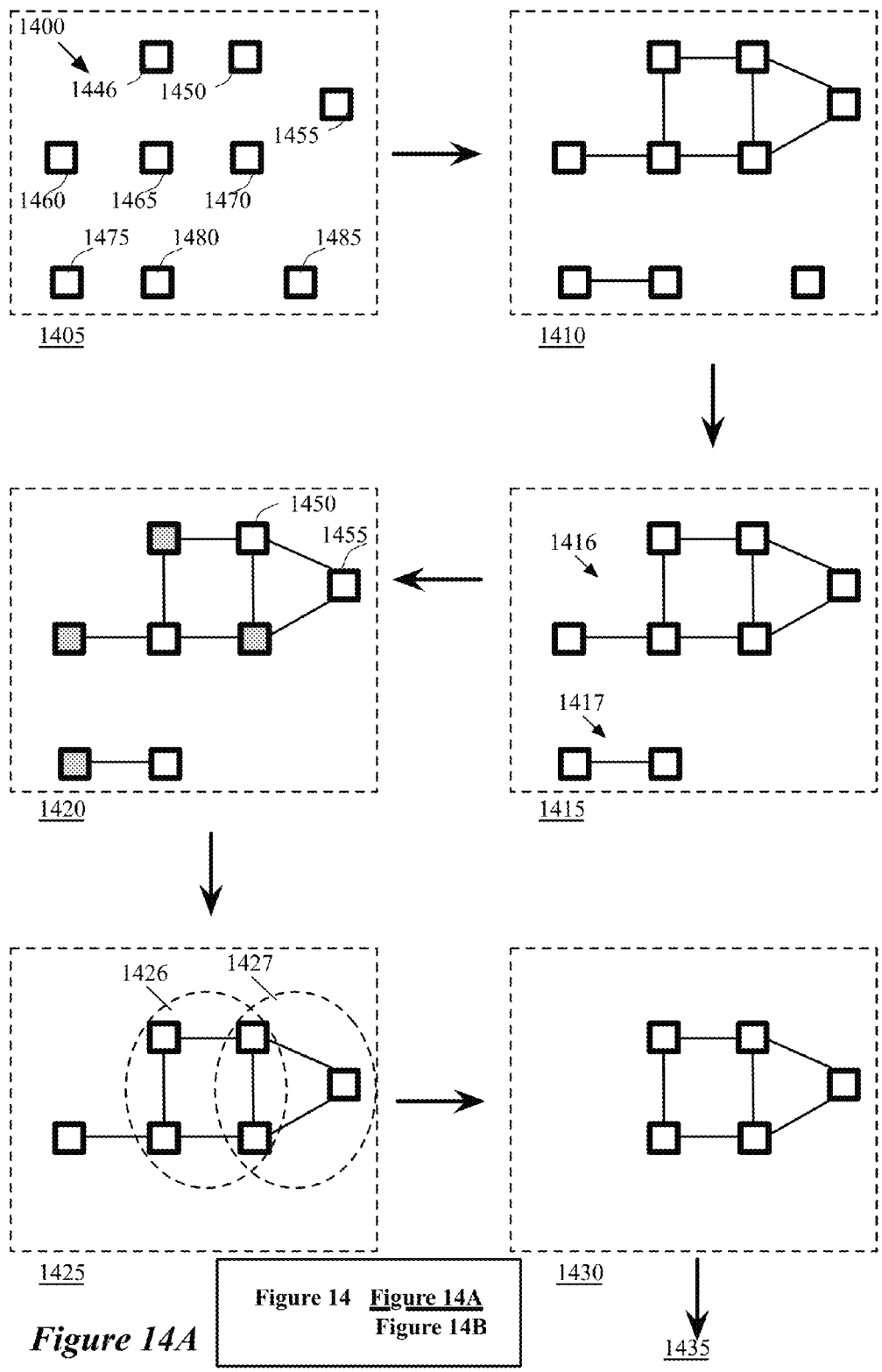
FIG. 14 illustrates that a DP loop marker generator generates a marker for a DP loop.
Figure 14B:
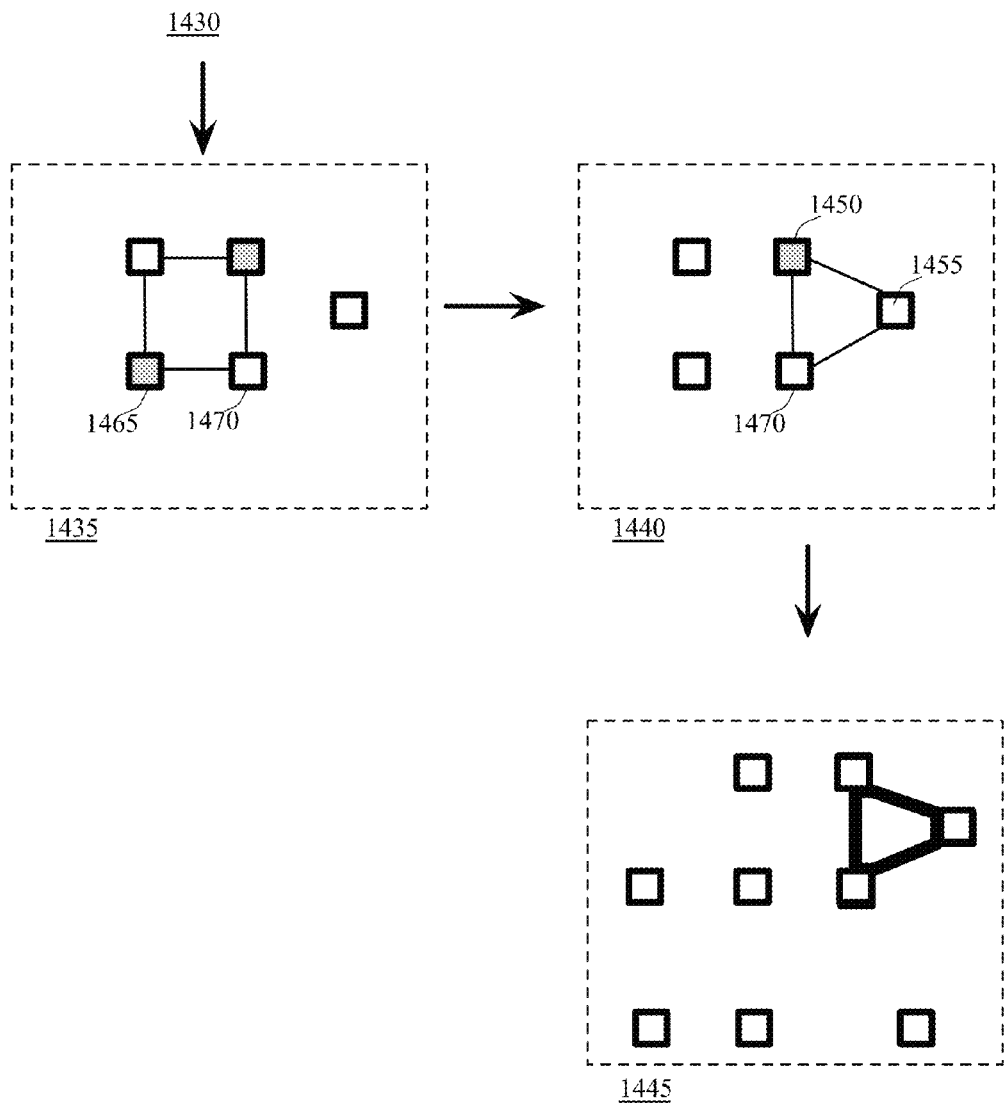

An example operation of the DP loop marker generator 1101 will now be described by reference to FIGS. 11, 12, 13, and 14. FIGS. 12 and 13 conceptually illustrate a process 1200 and a process 1300 that some embodiments perform to automatically, accurately, and efficiently find DP loops in a design layout and generate markers for the DP loops found. In some embodiments, the processes 1200 and 1300 are performed by the DP loop marker generator 1101. The process 1200 of some embodiments starts when the process 1200 receives or retrieves a design layout. FIG. 14 illustrates a design layout 1400. Specifically, FIG. 14 illustrates in nine different stages 1405-1445 that the DP loop marker generator 1101 generates a marker for a DP loop that the DP loop marker generator 1101 identifies in the design layout 1400.

The process 1200 begins by building (at 1205) graphs for the shapes in the received design layout. The first stage 1405 illustrates the design layout 1400. As shown, the design layout 1400 includes nine shapes 1446-1485. Other shapes that may be in the design layout 1400 are not depicted for the simplicity of description. Shapes 1446 and 1450 are within a minimum pitch. Shapes 1450 and 1455 are within the minimum pitch. Shapes 1450 and 1470 are within the minimum pitch. Shapes 1455 and 1470 are within the minimum pitch. Shapes 1470 and 1465 are within the minimum pitch. Shapes 1465 and 1460 are within the minimum pitch. Shapes 1475 and 1480 are within the minimum pitch. The graph builder 1110 builds graphs for the shapes 1446-1485 by connecting with a link each pair of shapes that are within the minimum pitch. The second stage 1410 illustrates the graphs that the graph builder 1110 built.

Referring to FIG. 12, the process 1200 then identifies (at 1210) disjoint sets of shapes in the design layout. The process 110 of some embodiments identifies disjoints sets based on the graphs representing the shapes in the received design layout. The third stage 1415 illustrates disjoint sets of shapes 1416 and 1417 that the disjoint set identifier 1125 has identified. As shown, the disjoint set 1416 includes five shapes 1446-1460 and the disjoint set 1417 includes shapes 1475 and 1480. The disjoint set identifier 1125 identifies disjoint sets 1416 and 1417 because shapes 1446-1460 are connected each other and shapes 1475-1480 are connected.

Next, the process 1200 selects (at 1215) one of the identified disjoint sets to examine. In this example, the disjoint set selector 1130 selects the disjoint set 1417 first. The process 1200 then traces (at 1220) the graph representing the selected disjoint set. As the process 1200 traces the graph, the process 1200 also assigns a color to each of the shape in the selected disjoint set. Using the graph tracer 1135, the violation detector 1140 traces the graph representing the disjoint set 1417 and assigns each shape in the disjoint set 1417 to one of the two masks for double patterning by assigning one of the two colors representing the two masks to the shape. The fourth stage 1420 illustrates that shapes 1475 and 1480 are assigned to two different colors (e.g., red and green depicted as grey and white, respectively).

The process 1200 next determines (at 1225) whether the selected disjoint set includes a DP loop. In some embodiments, the process 1200 determines that the selected disjoint set includes a DP loop when the process 1200 finds a pair of directly connected shapes in the graph as the process 1200 traces the graph representing the selected disjoint set. In some embodiments, the process 1200 stops tracing the graph after finding such pair of shapes. In other embodiments, the process 1200 keep tracing the graph until the process assigns colors to all shapes in the selected disjoint set. The violation detector 1140 determines that the selected disjoint set 1417 does not include a DP loop because the selected disjoint set 1417 does not include any pair of shapes that have the same assigned color.

When the process 1200 determines (at 1225) that the selected disjoint set does not include a DP loop, the process 1200 identifies (at 1235) the selected disjoint set as a disjoint set that does not have a DP loop violation. The process 1200 does not generate a marker for a disjoint set that does not have a DP loop violation. The DP loop marker generator 1101 does not generate a marker for the selected disjoint set 1417.

When the process 1200 determines (at 1225) that the selected disjoint set includes a DP loop, the process 1200 generates (at 1230) markers for each identified DP loop in the selected disjoint set. The operation 1230 of the process 1200 will be described in further detail by reference to FIG. 13.

The process 1200 then determines (at 1240) whether there are one or more identified disjoint sets of shapes that have not been examined. When the process 1200 determines (at 1240) that there are no more identified disjoint sets, the process 1200 ends. When the process 1200 determines (at 1240) that there are more identified disjoint sets, the process 1200 loops back to 1215 to select another identified disjoint set. The disjoint set selector 1130 selects the disjoint set 1416.

For the newly selected disjoint set, the process 1200 traces (at 1220) the graph representing the selected disjoint set. Using the graph tracer 1135, the violation detector 1140 traces the graph representing the disjoint set 1416 and assigns each shape in the disjoint set 1416 to one of the two masks for double patterning by assigning one of the two colors representing the two masks to the shape. The fourth stage 1420 illustrates that shapes 1446-1450 are assigned to two different colors. The graph tracer 1135 in this example starts tracking the graph from shape 1460 using a breadth first search. The graph tracer 1135 colors shape 1460 with a first color (e.g., red, depicted as grey). The graph tracer 1135 then moves on to shape 2165 and colors shape 1465 with a second color (e.g., green, depicted as white). Then the graph tracer 1135 moves on to shape 1446 and colors shape 1446 with the first color in order to avoid coloring shapes 1465 and 1446 with the same color. The graph tracer 1135 then moves on to shape 1470 and colors shape 1470 with the first color in order to avoid coloring shapes 1465 and 1470 with the same color. The graph tracer 1135 then moves on to shape 1450 and colors shape 1450 with the second color in order to avoid coloring shapes 1446 and the 1450 with the same color. The graph tracer 1135 then tries to color shape 1450 again because shape 1446 is also a shape that has not been traced from shape 1470. However, shape 1470 is already assigned to the second color. Because shape 1470 is assigned to the first color, there is no color assignment conflict for the shapes 1470 and 1450. The graph tracer 1135 then moves on to shape 1455 because shape 1446 is a shape that is next to be traced from shape 1470. The graph tracer 1135 assigns the first color to shape 1455 in order to avoid coloring shapes 1470 and 1455 with the same color.

The process 1200 next determines (at 1225) whether the newly selected disjoint set includes a DP loop. The violation detector 1140 determines that the selected disjoint set 1416 includes a DP loop because the selected disjoint set 1416 has a pair of shapes 1450 and 1455 that are directly connected but are assigned to the same color. In this example, the violation detector 1140 happens to have had to trace the graph representing the disjoint set 1466 and color all six shapes 1446-1470 in the disjoint set 1416 to identify a pair of directly connected shapes that have the same assigned color (i.e., shapes 1450 and 1455).

The process 1200 in this example determines (at 1225) that the newly selected disjoint set has a DP loop and proceeds to 1230 to identify DP loops in the newly selected disjoint set and generate a marker for each identified DP loop. Details of identifying DP loops in the selected disjoint set and generating markers will now be described by reference to FIG. 13. FIG. 13 conceptually illustrates a process 1300 that some embodiments perform to identify any DP loop in a disjoint set of shapes. As mentioned above, the process 1300 in some embodiments is performed by the DP loop marker generator 1101. Specifically, the DP loop marker generator 1101 that performs the process 1300 is of those embodiments that stop tracing the graph representing a disjoint set after finding a pair of directly connected shapes in the disjoint set. The process 1300 starts when the process 1300 receives a disjoint set of shapes that is determined to have at least one DP loop.

The process 1300 begins by identifying (at 1305) all subsets of shapes in the received disjoint set that each subset includes shapes that form a loop and shapes that fall within the loop. Referring to FIG. 14, the subset identifier 1150 in this example identifies in the disjoint set 1416 two subsets 1426 and 1427 that each form a loop or fall in the loop using DRC commands. As illustrated in the fifth stage 1425, the subset 1426 includes shapes 1446, 1450, 1465, and 1470 that form a loop. The subset 1427 includes shapes 1450, 1455, and 1470 that form a loop. By identifying these subsets, the subset identifier 1150 filters out shape 1460 that does not form a loop or fall within the loop. The sixth stage 1430 illustrates five shapes 1446, 1450, 1455, 1465, and 1470 that make up the identified subsets 1426 and 1427.

Next, the process 1300 selects (at 1310) an identified subset to examine and then traces (at 1315) a subgraph that represents the selected subset of shapes. The subset checker 1160 in this example uses the graph selector 1155 to select subset 1426 first. The subset checker 1160 uses the graph tracer 1135 to trace the subgraph that represents the selected subset 1426. The graph tracer 1135 in this example traces the subgraph representing the subset 1426 from shape 1465 and colors all four shapes of 1465, 1446, 1470, and 1450 in that order.

The process 1300 then determines (at 1320) whether the selected subset has a DP loop. The subset checker 1160 determines that the subset 1426 does not include a DP loop because the subset 1426 does not include a pair of directed connected shapes that are assigned to the same color as illustrated in the seventh stage 1435 of FIG. 14.

When the process 1300 determines (at 1320) that the selected subset has a DP loop, the process 1300 generates (at 1325) a marker for the selected subset of shapes. Otherwise, the process 1300 identifies (at 1330) the selected subset as a subset that does not have a DP loop. The subset checker 1426 identifies the subset 1426 as a subset that does not include a DP loop.

The process 1300 then determines (at 1320) that there are one or more identified subsets of the received disjoint set that have not been examined. When the process 1300 determines (at 1335) that there are no more identified subsets, the process 1300 ends. When the process 1300 determines (at 1335) that there are more identified subsets, the process 1300 loops back to 1310 to select another identified subset of the received disjoint set. In this example, the subset checker 1160 uses the graph selector 1155 to select a subgraph that represents the subset of shapes 1427.

The process 1300 then traces (at 1315) this subgraph that represents the newly selected subset of shapes. The subset checker 1160 uses the graph tracer 1135 to trace the subgraph that represents the subset of shapes 1427. The graph tracer 1135 in this example traces the subgraph from shape 1450 and colors all three shapes of 1450, 1455, and 1470 in that order.

The process 1300 in this example then determines (at 1320) that the selected subset has a DP loop. The subset checker 1160 determines that the subset 1427 includes a DP loop because the subset 1427 includes a pair of directed connected shapes that are assigned to the same color (i.e., shapes 1470 and 1455) as illustrated in the eighth stage 1440 of FIG. 14.

Because the process 1300 determines (at 1320) that the selected subset has a DP loop, the process 1300 generates (at 1325) a marker for the selected subset of shapes. The marker generator 1165 generates a marker that indicates the subset 1427 form a DP loop as illustrated in the ninth stage 1445.

Figure 15A:
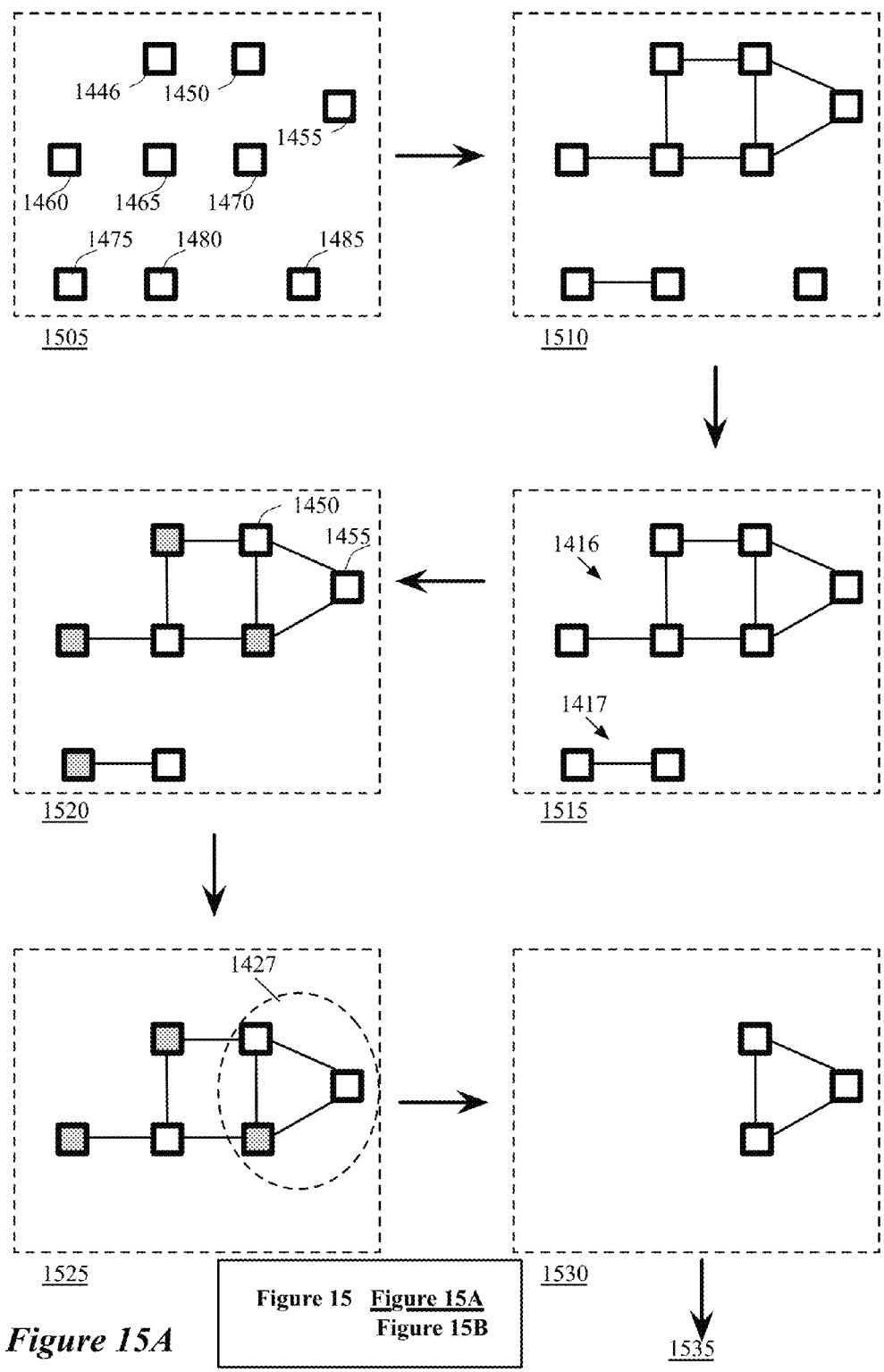
FIG. 15 illustrates that a DP loop marker generator generates a marker for a DP loop.
Figure 15B:
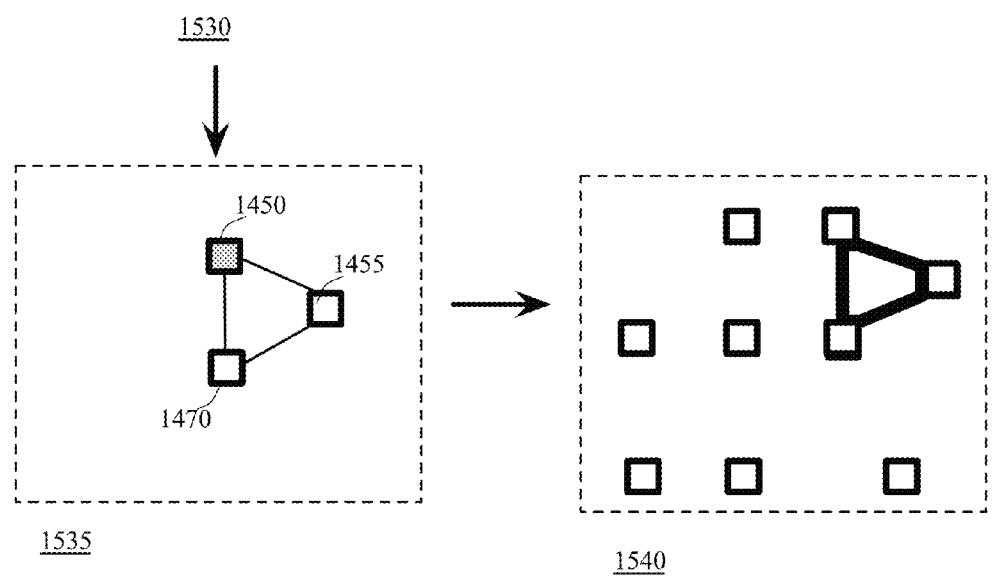

Another example operation of the DP loop marker generator 1101 will now be described by reference to FIGS. 13 and 15. Specifically, the DP loop marker generator 1101 that performs the process 1300 in this another example is of those embodiments that do not stop tracing the graph representing a disjoint set after finding a pair of directly connected shapes in the disjoint set. FIG. 15 illustrates the design layout 1400. Specifically, FIG. 15 illustrates in eight different stages 1505-1540 that the DP loop marker generator 1101 generates a marker for a DP loop that the DP loop marker generator 1101 identifies in the design layout 1400. The first four stages 1505-1520 are identical with the first four stages 1405-1420 described above by reference to FIG. 14.

The process 1300 begins by identifying (at 1305) only those subsets of shapes in the received disjoint set that each subset includes shapes that (1) form a loop that includes at least one pair of directly connected shapes that have the same assigned color or (2) shapes that fall within such loops. Referring to FIG. 15, the subset identifier 1150 in this example identifies only the subset 1427 because subset 1427 has a pair of directly connected shapes that are assigned to the same color (i.e., shapes 1450 and 1455) as illustrated in the fifth stage 1525. The sixth stage 1530 illustrates that the subset identifier 1150 has thereby filtered out shapes 1446, 1450, and 1465.

Next, the process 1300 selects (at 1310) an identified subset to examine and then traces (at 1315) a subgraph that represents the selected subset of shapes. The subset checker 1160 in this example uses the graph selector 1155 to select subset 1427. The subset checker 1160 uses the graph tracer 1135 to trace the subgraph that represents the selected subset 1427. The graph tracer 1135 in this example traces the subgraph representing the subset 1427 from shape 1450 and reassigns colors to all three shapes of 1450, 1455, and 1470 in that order.

The subset checker 1160 reassigns colors to the shapes in the selected subset in order to check whether the loop formed by the shapes in the selected subset has a pair of directly connected shapes that have the same reassigned color. That is, the reassigning colors eliminates the chance that the pair of shapes that had the same assigned color previously had the same color not because the selected subset had a DP loop but because that pair of shapes were also part of another DP loop formed by shapes that do not belong to the selected subset. To illustrate such a case, assume that shape 1460 is also directly connected to shape 1446 and tracing this graph starts from shape 1460. Then, the shapes 1446 and 1465 would have the same assigned color and the shapes 1450 and 1470 would have the same assigned color. The loop formed by the four shapes 1446, 1450, 1470, and 1465 then would have two pairs of directly connected shapes that each have the same assigned color but the loop is not a DP loop. That is, when colors are reassigned to these four shapes, no pair of directly connected shapes would have the same reassigned color.

The process 1300 in this example then determines (at 1320) that the selected subset has a DP loop. The subset checker 1160 determines that the subset 1427 includes a DP loop because the subset 1427 includes a pair of directly connected shapes that are assigned to the same color (i.e., shapes 1470 and 1455) as illustrated in the seventh stage 1535.

Because the process 1300 determines (at 1320) that the selected subset has a DP loop, the process 1300 generates (at 1325) a marker for the selected subset of shapes. The marker generator 1165 generates a marker that indicates the subset 1427 form a DP loop as illustrated in the eight stage 1540.

Having described the DP loop marker generator of some embodiments, Section II will describe several use cases of the DP loop marker generator.

II. Use Examples

The novel method of some embodiments described so far automatically, accurately, and efficiently identifies DP loops in a design layout and generate markers for the DP loops. Section II will first describe applying the novel method of different embodiments to a design layout. Then, a description of applying the novel method to several more design layouts described above by reference to FIG. 10 will follow in order to illustrate that applying the novel method does not result in false or missed identification of DP loops.

Figures 16, 16A, 16B:
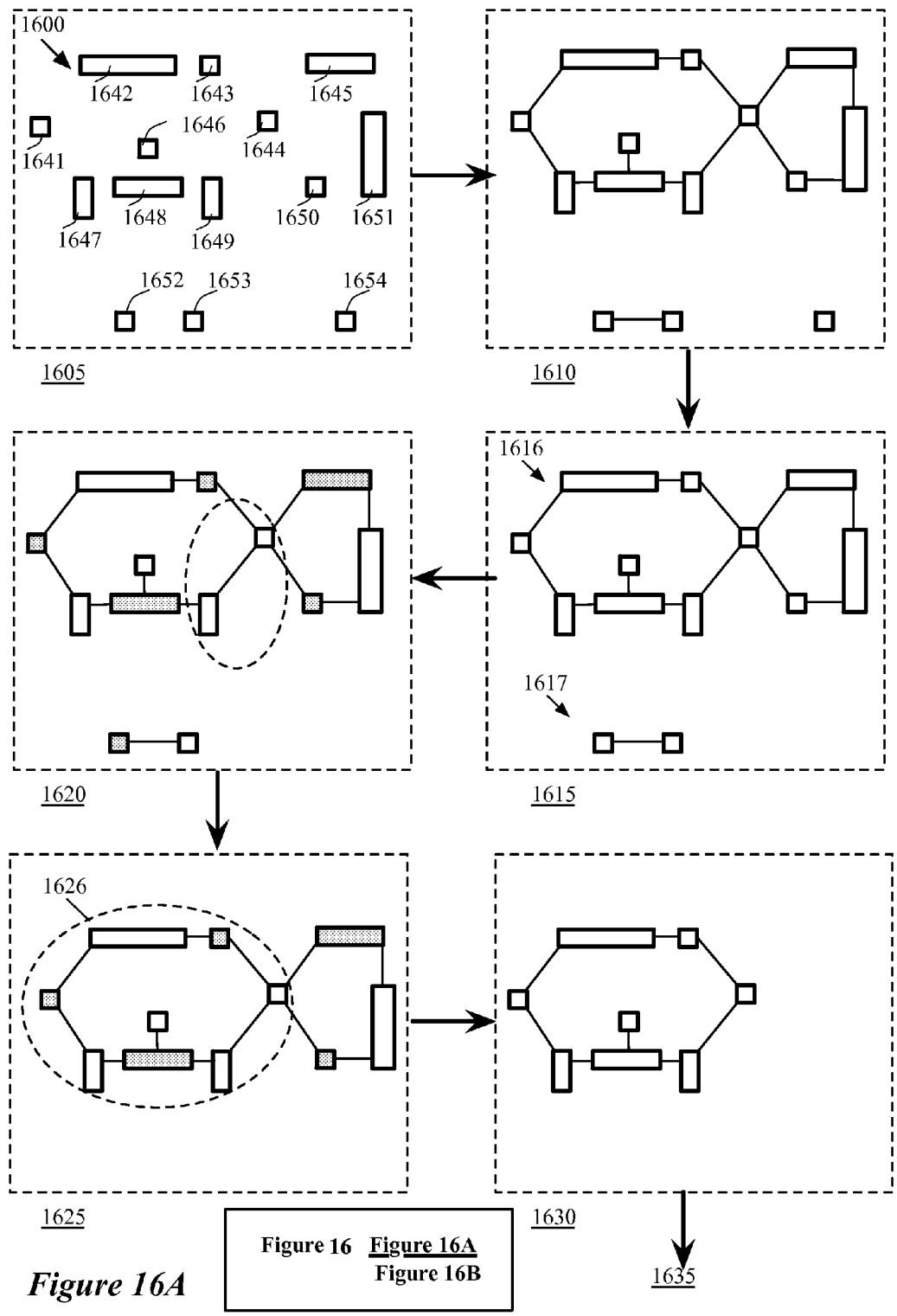
FIG. 16 illustrates that a DP loop marker generator generates a marker for a DP loop.
Figure 16B:
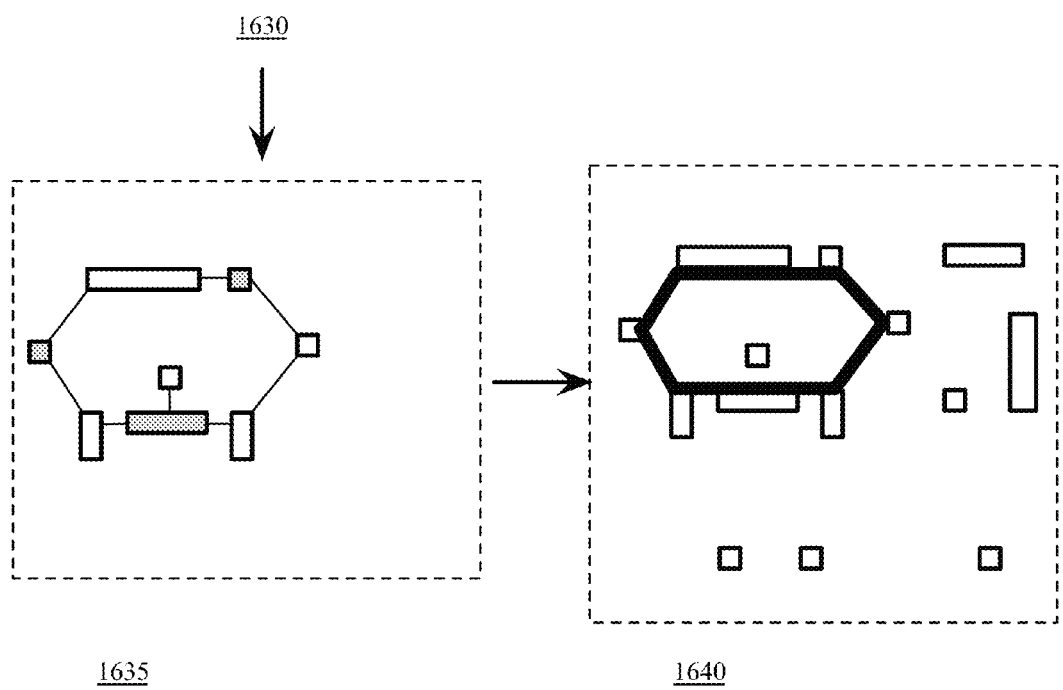

FIG. 16 illustrates in eight different stages 1605-1640 that a DP loop marker generator identifies a DP loop in a design layout 1600 and generates a marker for the DP loop by employing the novel method of some embodiments. This figure illustrates an example in which the DP loop marker generator does not stop tracing a graph after finding a pair of directly connected shapes are found in the graph.

The first stage 1605 illustrates that the design layout 1600 includes fourteen shapes 1641-1654 in a layer of the design layout 1600. Other shapes that may exist in this layer and other layers of the design layout 1600 are not depicted in this figure for simplicity of description. In the design layout 1600, the following pairs of shapes are within a minimum pitch: shapes 1641 and 1642, shapes 1642 and 1643, shapes 1644 and 1645, shapes 1645 and 1651, shapes 1650 and 1651, shapes 1644 and 1650, shapes 1644 and 1649, shapes 1648 and 1649, shapes 1646 and 1648, shapes 1647 and 1648, shapes 1641 and 1647, and shapes 1652 and 1653. Shape 1654 is not within the minimum pitch from another shape in the design layout 1600.

The second stage 1610 illustrates that the DP loop marker generator has built graphs for the shapes in the design layout 1600 by connecting each pair of shapes that are within the minimum pitch with a link. The third stage 1615 illustrates two connected graphs representing two disjoint sets 1616 and 1617 that the DP loop marker generator has identified. As shown, the disjoint set 1616 includes eleven shapes 1641-1651 and the disjoint set 1617 includes two shapes 1652 and 1653.

The fourth stage 1620 illustrates that the DP loop marker generator has traced the graphs representing the two disjoint sets 1616 and 1617 and assigned the shapes to two masks for double patterning by assigning two different colors to the shapes. For the disjoint set 1617, the DP loop marker generator assigns a first color (e.g., red, depicted as grey) to shape 1652 and a second color (e.g., green, depicted as white). For the disjoint set 1616, the DP loop marker generator has traced the graph from shape 1641. The DP loop marker generator assigns the first color to shape 1641. Using the breadth first search, the DP loop marker generator moves on to shapes 1642, 1647, 1643, 1648, 1644, 1646, 1649 and 1645 in that order and assigns different colors to these shapes by avoiding assigning the same color to each pair of directly connected shapes. When the DP loop marker generator checks the neighboring nodes of the shape 1650, the DP loop marker generator identifies that shapes 1650 and 1649 are assigned to the same color. The DP loop marker generator in this example keeps tracing the graph for the disjoint set 1616 and assigns the first color to shapes 1645 and 1650 and the second color to shape 1651. As shown, the disjoint set 1616 includes a pair of directly connected shapes 1644 and 1649 that have the same assigned color.

The fifth stage 1625 illustrates that the DP loop marker generator has filtered out the disjoint set 1617 because the disjoint set 1617 does not include any pair of directly connected shapes that have the same assigned color. Also, the DP loop marker generator identifies that a subset 1626, which includes eight shapes 1641-1644 and 1646-1649, is a subset of shapes in the disjoint set 1616 that includes shapes that (1) form a loop that includes the pair of directed connected shapes that have the same assigned color (i.e., shapes 1641-1644 and 1647-1649) or (2) fall within such loop (i.e., shape 1646). The DP loop marker generator uses DRC commands to identify the subset 1626.

The sixth stage 1630 illustrates that the DP loop marker generator has filtered out shapes 1644, 1645, 1650, and 1651 because a loop that these four shapes form does not include a pair of directly connected shapes that have the same assigned color. The seventh stage 1635 illustrates that the DP loop marker generator has traced a subgraph representing the subset 1626 and reassign colors to the shapes. The DP loop marker generator determines that shapes 1641-1644 and 1647-1649 form a loop that includes a pair of directly connected shapes that have the same reassigned color (i.e., shapes 1649 and 1644). The eight stage 1640 illustrates that the DP loop marker generator has generated a marker 1639 for indicating that the seven shapes 1641-1644 and 1647-1649 form a DP loop.

Figures 17, 17A, 17B:
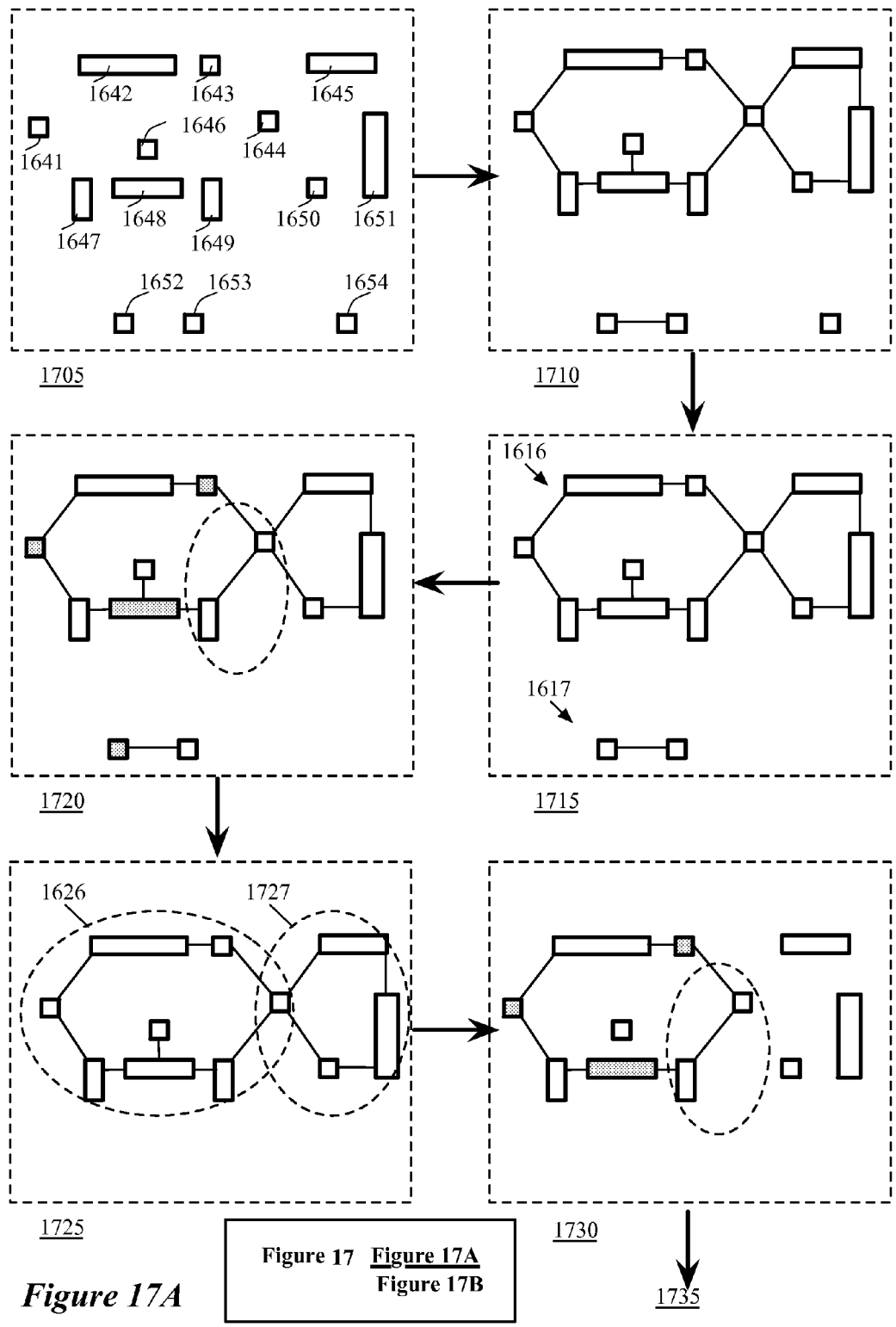
FIG. 17 illustrates that a DP loop marker generator generates a marker for a DP loop.
Figure 17B:
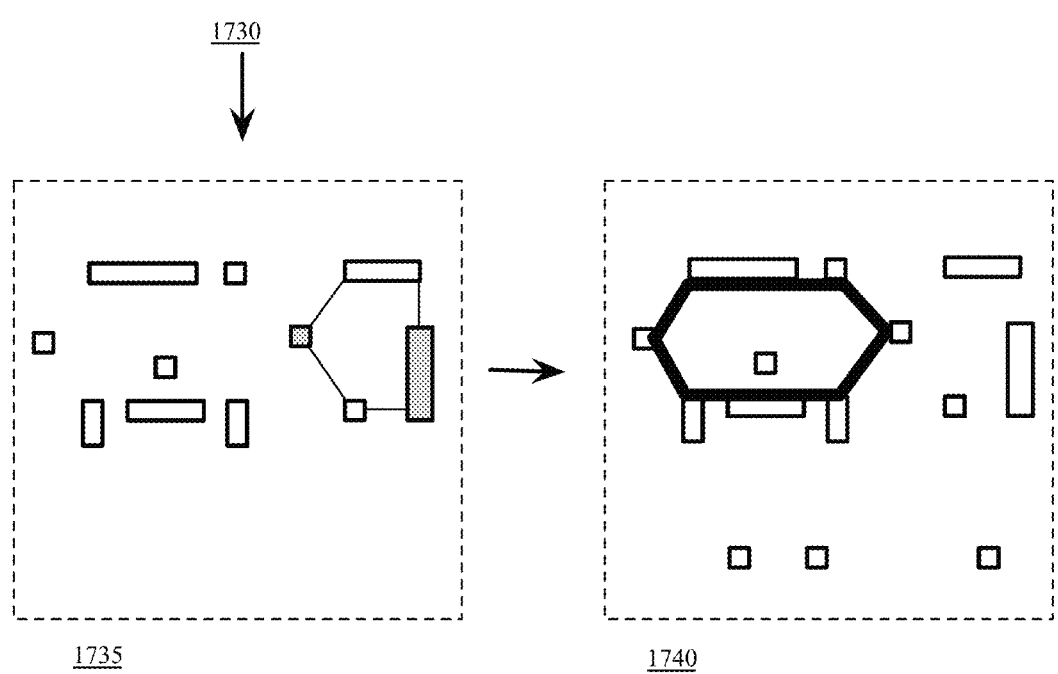

FIG. 17 illustrates in eight different stages 1705-1740 that a DP loop marker generator identifies a DP loop in a design layout 1600 and generates a marker for the DP loop by employing the novel method of some embodiments. This figure illustrates an example in which the DP loop marker generator stops tracing a graph after finding a pair of directly connected shapes are found in the graph.

The first three stages 1705-1715 are identical with the first three stages 1605-1615 described above by reference to FIG. 16. The fourth stage 1720 illustrates that the DP loop marker generator has traced the graphs representing the two disjoint sets 1616 and 1617 and assigned the shapes to two masks for double patterning by assigning two different colors to the shapes. For the disjoint set 1617, the DP loop marker generator assigns a first color (e.g., red, depicted as grey) to shape 1652 and a second color (e.g., green, depicted as white). For the disjoint set 1616, the DP loop marker generator has traced the graph from shape 1641. The DP loop marker generator assigns the first color to shape 1641. Using the breadth first search, the DP loop marker generator moves on to shapes 1642, 1647, 1643, 1648, 1644, 1646, 1649 and 1645 in that order and assigns different colors to these shapes by avoiding assigning the same color to each pair of directly connected shapes. When the DP loop marker generator checks the neighboring nodes of the shape 1650, the DP loop marker generator identifies that shapes 1650 and 1649 are assigned to the same color. The DP loop marker generator in this example stops tracing the graph for the disjoint set 1616.

The fifth stage 1725 illustrates that the DP loop marker generator has filtered out the disjoint set 1617 because the disjoint set 1617 does not include any pair of directly connected shapes that have the same assigned color. Also, the DP loop marker generator identifies that the subset 1626, which includes eight shapes 1641-1644 and 1646-1649, is a subset of shapes in the disjoint set 1616 that includes shapes that form a loop (i.e., shapes 1641-1644 and 1647-1649) or (2) fall within such loop (i.e., shape 1646). The DP loop marker generator identifies that a subset 1727, which includes four shapes 1644, 1645, 1650, and 1651, is a subset of shapes in the disjoint set 1616 that includes shapes that form a loop (i.e., shapes 1644, 1645, 1650, and 1651) or (2) fall within such loop. The DP loop marker generator uses DRC commands to identify the subsets 1626 and 1727.

The sixth stage 1730 illustrates that the DP loop marker generator has traced the subgraph representing the subset 1626 and assigns colors to the shapes in the subset 1626. The DP loop marker generator identifies that the seven shapes 1641-1644 and 1647-1649 forms a DP loop because the loop includes a pair of directly connected shapes 1649 and 1644 that have the same assigned color.

The seventh stage 1735 illustrates that the DP loop marker generator has traced the subgraph representing the subset 1727 and assigns colors to the shapes in the subset 1727. The DP loop marker generator identifies that the four shapes 1644, 1645, 1650, and 1651 forms a loop that is not a DP loop because the loop does not includes a pair of directly connected shapes that have the same assigned color. The eighth stage 1740 illustrates that the DP loop marker generator has generated a marker 1739 for indicating that the seven shapes 1641-1644 and 1647-1649 form a DP loop.

Figure 18:
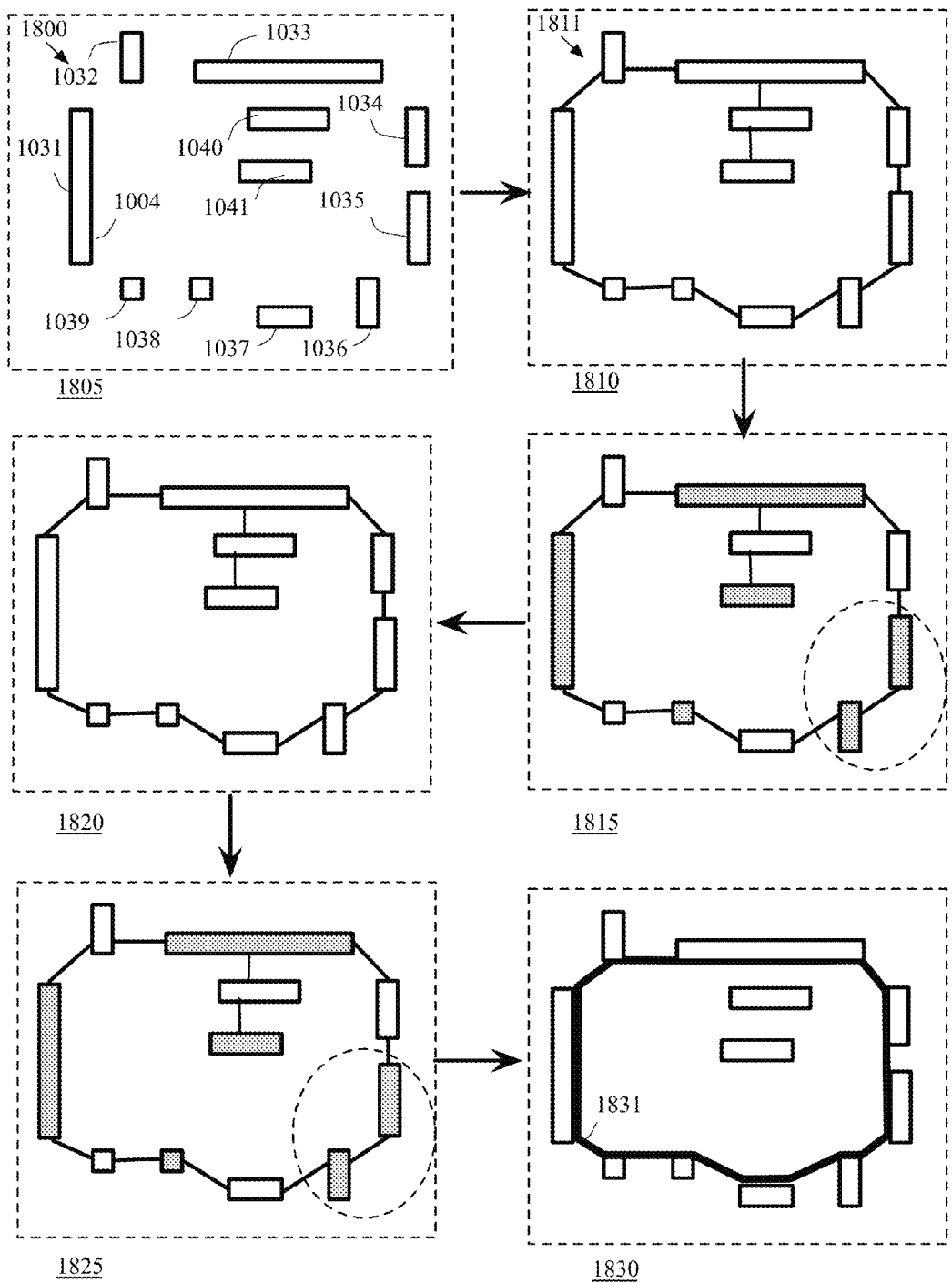
FIG. 18 illustrates that a DP loop marker generator generates a marker for a DP loop.

FIG. 18 illustrates in six different stages 1805-1830 that a DP loop marker generator identifies a DP loop in a design layout 1800 and generates a marker for the DP loop. The design layout 1800 includes shapes 1031-1041 described above by reference to FIG. 10. As described above, a conventional EDA employing a conventionaly technique to identify DP loops incorrectly identifies a DP loop and generates a marker for a false partial loop.

The first stage 1805 illustrates that the design layout 1800. In the design layout 1800, the following pairs of shapes are within a minimum pitch: shapes 1031 and 1032, shapes 1032 and 1033, shapes 1033 and 1034, shapes 1034 and 1035, shapes 1035 and 1036, shapes 1036 and 1037, shapes 1037 and 1038, shapes 1038 and 1039, shapes 1031 and 1039, shapes 1033 and 1040, and shapes 1040 and 1041.

The second stage 1810 illustrates that the DP loop marker generator has built a graph for the shapes in the design layout 1800 by connecting each pair of shapes that are within the minimum pitch with a link. The DP loop marker generator also identifies the eleven shapes 1031-1041 as a disjoint set 1811 because all eleven shapes 1031-1041 are connected to each other.

The third stage 1815 illustrates that the DP loop marker generator has traced the graph representing the disjoint sets 1811 and assigned the shapes to two masks for double patterning by assigning two different colors to the shapes. For the disjoint set 1811, the DP loop marker generator traces the graph from shape 1031. The DP loop marker generator assigns the first color to shape 1041. Using the breadth first search, the DP loop marker generator moves on to shapes 1032, 1039, 1033, 1038, 1034, 1040, 1037, 1035, 1041, and 1036 in that order and assigns different colors to these shapes by avoiding assigning the same color to each pair of directly connected shapes. When the DP loop marker generator checks the neighboring nodes of the shape 1035, the DP loop marker generator identifies that shapes 1035 and 1036 are assigned to the same color. The DP loop marker generator in this example happens to identify the conflict after all shapes have assigned colors.

The fourth stage 1820 illustrates that the DP loop marker generator has selected the disjoint set 1811 to further examine. Also, the DP loop marker generator identifies that a subset of shapes that includes shapes that (1) form a loop that includes the pair of directed connected shapes that have the same assigned color or (2) fall within such loop is the disjoint set 1811 itself.

The fifth stage 1825 illustrates that the DP loop marker generator has traced the graph representing the disjoint set 1811 and reassigned colors to the shapes. The DP loop marker generator determines that shapes 1031-1041 form a loop that includes a pair of directly connected shapes that have the same reassigned color (i.e., shapes 1035 and 1036). The DP loop marker generator determines that shapes are forming a loop when a shape that is to be visited from one shape is already visited from another shape (e.g., when a shape has two parent nodes). A node to be visited from a particular shape is a neighboring node of the particular shape that is not a node from which the particular node is visited. For instance, when the shape 1031 is the root node, shape 1032 is a node to be visited from the shape 1031. Shape 1031 is not a node to be visited from the node 1032 because shape 1031 is a node from which shape 1032 is visited. Shape 1033, on the other hand, is a node to be visited from shape 1032 because shape 1033 is a neighboring node of shape 1033 but is not a node from which shape 1033 is visited.

The sixth stage 1830 illustrates that the DP loop marker generator has generated a marker 1831 for indicating that the nine shapes 1031-1041 form a DP loop. In contrast to the marker 1004 that the conventional EDA application identifies for the design layout 1800, the marker 1831 does not indicate that shapes 1040 and 1041 are shapes that form the DP loop.

Figure 19:
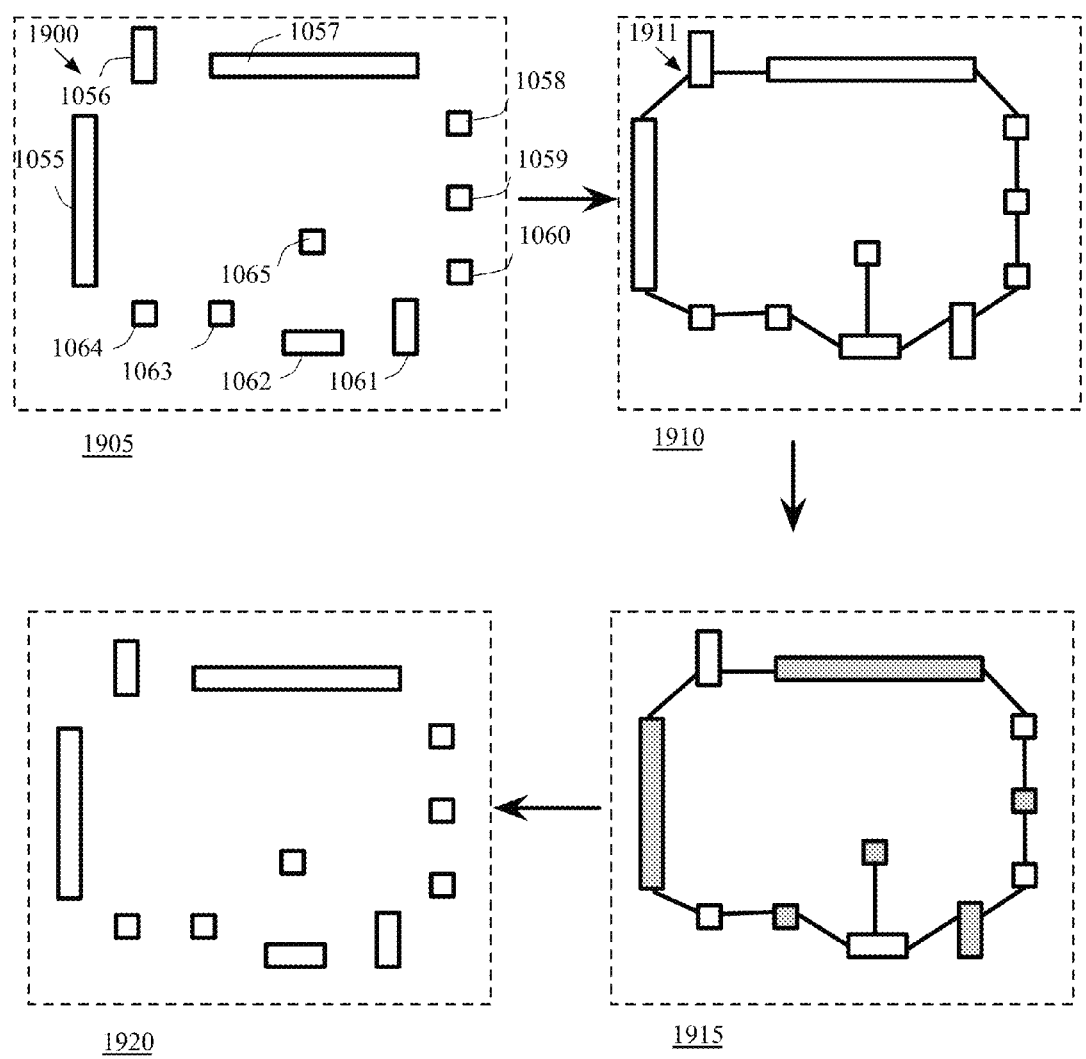
FIG. 19 illustrates that a DP loop marker generator does not generate a marker for a DP loop.

FIG. 19 illustrates in four different stages 1905-1920 that a DP loop marker generator does not identify a DP loop in a design layout 1900 and generates no marker for the design layout 1900. The design layout 1900 includes shapes 1055-1065 described above by reference to FIG. 10. As described above, a conventional EDA employing a conventional technique to identify DP loops identifies a DP loop for the design layout 1900 when there is no DP loop in the design layout 1900.

The first stage 1905 illustrates that the design layout 1900. In the design layout 1900, the following pairs of shapes are within a minimum pitch: shapes 1055 and 1056, shapes 1056 and 1057, shapes 1057 and 1058, shapes 1058 and 1059, shapes 1059 and 1060, shapes 1060 and 1061, shapes 1061 and 1062, shapes 1062 and 1063, shapes 1063 and 1064, shapes 1064 and 1055, and shapes 1062 and 1065.

The second stage 1910 illustrates that the DP loop marker generator has built a graph for the shapes in the design layout 1900 by connecting each pair of shapes that are within the minimum pitch with a link. The DP loop marker generator also identifies the eleven shapes 1055-1065 as a disjoint set 1911 because all eleven shapes 1031-1041 are connected to each other.

The third stage 1915 illustrates that the DP loop marker generator has traced the graph representing the disjoint sets 1911 and assigned the shapes to two masks for double patterning by assigning two different colors to the shapes. For the disjoint set 1911, the DP loop marker generator traces the graph from shape 1055. The DP loop marker generator assigns the first color to shape 1055. Using the breadth first search, the DP loop marker generator moves on to shapes 1056, 1064, 1057, 1063, 1058, 1062, 1059, 1061, and 1060 in that order and assigns different colors to these shapes by avoiding assigning the same color to each pair of directly connected shapes. When the DP loop marker generator checks the neighboring nodes of the shape 1060, the DP loop marker generator identifies that shape 1061 is already visited and thus shapes 1055-1063 is forming a loop. The DP loop marker generator does not find a pair of directly connected shapes that have the same assigned color in the disjoint set 1911.

The fourth stage 1920 illustrates that the DP loop marker generator does not generate any marker for the disjoint set 1911, in contrast to the example 1015 in which the conventional EDA application generates a marker for the eleven shapes 1055-1065 to indicate these eleven shapes form a DP loop.

Figure 20:
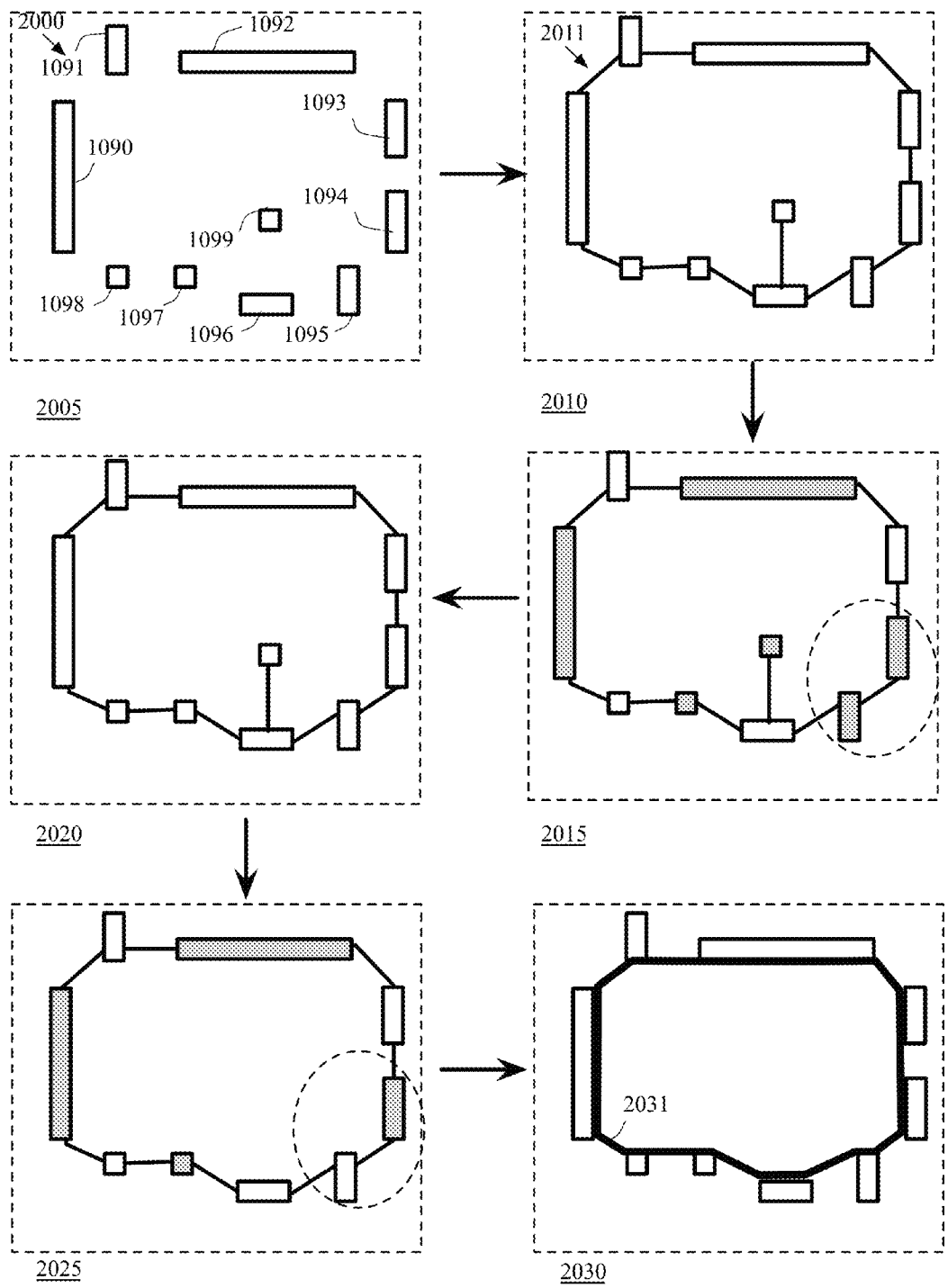
FIG. 20 illustrates that a DP loop marker generator generates a marker for a DP loop.

FIG. 20 illustrates in six different stages 2005-2030 that a DP loop marker generator identifies a DP loop in a design layout 2000 and generates a marker for the DP loop. The design layout 2000 includes shapes 1090-1099 described above by reference to FIG. 10. As described above, a EDA employing a conventional technique to identify DP loops fails to identify a DP loop.

The first stage 2005 illustrates that the design layout 2000. In the design layout 2000, the following pairs of shapes are within a minimum pitch: shapes 1090 and 1091, shapes 1091 and 1092, shapes 1092 and 1093, shapes 1093 and 1094, shapes 1094 and 1095, shapes 1096 and 1097, shapes 1097 and 1098, shapes 1098 and 1090, and shapes 1096 and 1099.

The second stage 2010 illustrates that the DP loop marker generator has built a graph for the shapes in the design layout 2000 by connecting each pair of shapes that are within the minimum pitch with a link. The DP loop marker generator also identifies the ten shapes 1090-1099 as a disjoint set 2011 because all ten shapes 1031-1041 are connected to each other.

The third stage 2015 illustrates that the DP loop marker generator has traced the graph representing the disjoint sets 2011 and assigned the shapes to two masks for double patterning by assigning two different colors to the shapes. For the disjoint set 2011, the DP loop marker generator traces the graph from shape 1090. The DP loop marker generator assigns the first color to shape 1090. Using the breadth first search, the DP loop marker generator moves on to shapes 1091, 1098, 1092, 1097, 1093, 1096, 1094, 1099, and 1095 in that order and assigns different colors to these shapes by avoiding assigning the same color to each pair of directly connected shapes. When the DP loop marker generator checks the neighboring nodes of the shape 1094, the DP loop marker generator identifies that shapes 1095 and 1094 are assigned to the same color and that shapes 1090-1098 is forming a loop. The DP loop marker generator in this example happens to identify the conflict after all shapes have assigned colors.

The fourth stage 2020 illustrates that the DP loop marker generator has selected the disjoint set 2011 to further examine. Also, the DP loop marker generator identifies that a subset of shapes that includes shapes that (1) form a loop that includes the pair of directed connected shapes that have the same assigned color or (2) fall within such loop is the disjoint set 2011 itself.

The fifth stage 2025 illustrates that the DP loop marker generator has traced the graph representing the disjoint set 2011 and reassigned colors to the shapes. The DP loop marker generator determines that shapes 1090-1098 form a loop that includes a pair of directly connected shapes that have the same reassigned color (i.e., shapes 1094 and 1095).

The sixth stage 2030 illustrates that the DP loop marker generator has generated a marker 2031 for indicating that the nine shapes 1031-1041 form a DP loop. In contrast to the example 1025 in which the conventional EDA application fails to identify a marker for shapes 1090-1098, the DP loop marker generator has generated the marker 2031.

III. Electronic System

Many of the above-described features and applications are implemented as software processes that are specified as a set of instructions recorded on a computer readable storage medium (also referred to as computer readable medium). When these instructions are executed by one or more processing unit(s) (e.g., one or more processors, cores of processors, or other processing units), they cause the processing unit(s) to perform the actions indicated in the instructions. Examples of computer readable media include, but are not limited to, CD-ROMs, flash drives, RAM chips, hard drives, EPROMs, etc. The computer readable media does not include carrier waves and electronic signals passing wirelessly or over wired connections.

In this specification, the term "software" is meant to include firmware residing in read-only memory or applications stored in magnetic storage, which can be read into memory for processing by a processor. Also, in some embodiments, multiple software inventions can be implemented as sub-parts of a larger program while remaining distinct software inventions. In some embodiments, multiple software inventions can also be implemented as separate programs. Finally, any combination of separate programs that together implement a software invention described here is within the scope of the invention. In some embodiments, the software programs, when installed to operate on one or more electronic systems, define one or more specific machine implementations that execute and perform the operations of the software programs.

Figure 21:
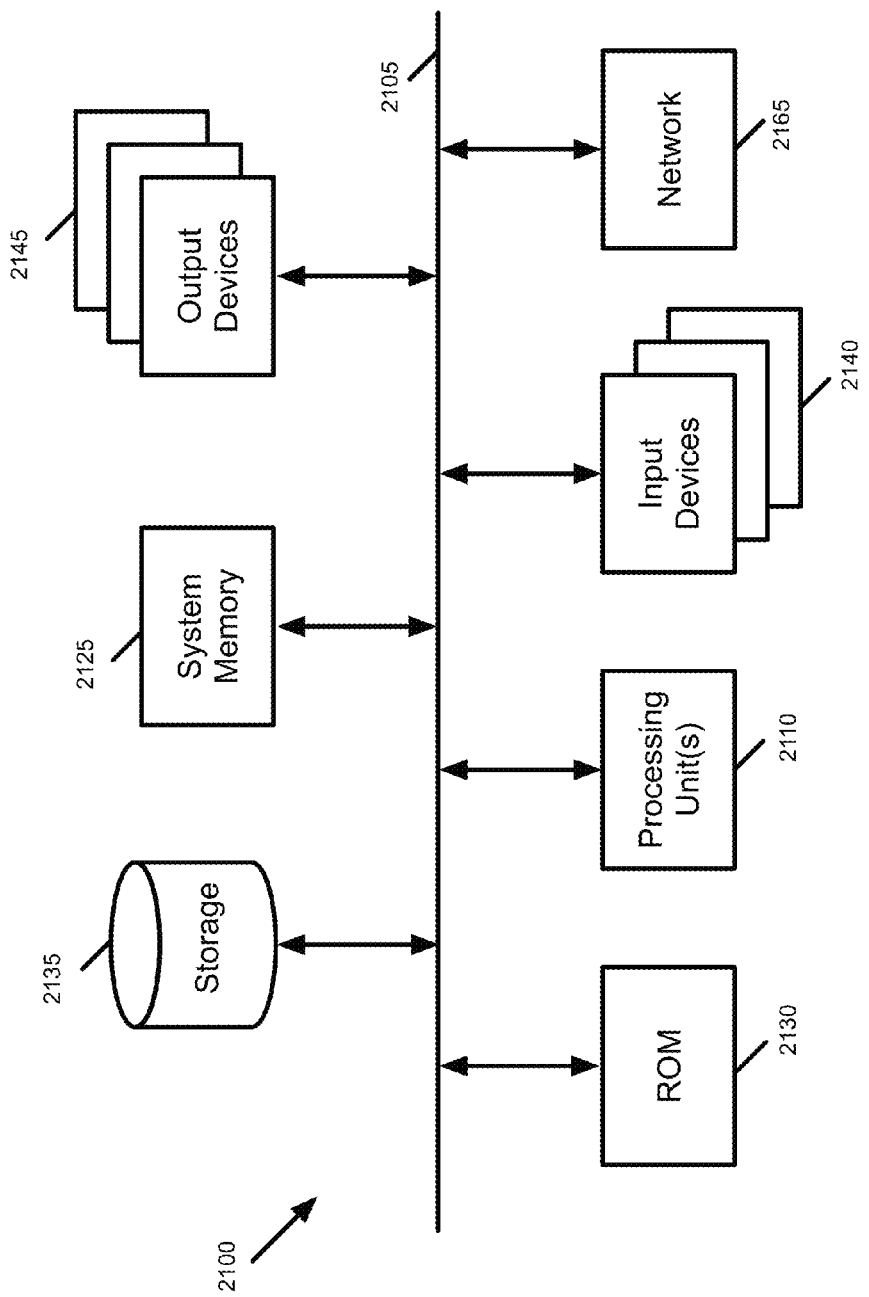
FIG. 21 illustrates an electronic system with which some embodiments of the invention are implemented.

FIG. 21 conceptually illustrates an electronic system 2100 with which some embodiments of the invention are implemented. The electronic system 2100 can be used to execute any of the control, virtualization, or operating system applications described above. The electronic system 2100 may be a computer (e.g., a desktop computer, personal computer, tablet computer, server computer, mainframe, a blade computer etc.), phone, PDA, or any other sort of electronic device. Such an electronic system includes various types of computer readable media and interfaces for various other types of computer readable media. Electronic system 2100 includes a bus 2105, processing unit(s) 2110, a system memory 2125, a read-only memory 2130, a permanent storage device 2135, input devices 2140, and output devices 2145.

The bus 2105 collectively represents all system, peripheral, and chipset buses that communicatively connect the numerous internal devices of the electronic system 2100. For instance, the bus 2105 communicatively connects the processing unit(s) 2110 with the read-only memory 2130, the system memory 2125, and the permanent storage device 2135.

From these various memory units, the processing unit(s) 2110 retrieve instructions to execute and data to process in order to execute the processes of the invention. The processing unit(s) may be a single processor or a multi-core processor in different embodiments.

The read-only-memory (ROM) 2130 stores static data and instructions that are needed by the processing unit(s) 2110 and other modules of the electronic system. The permanent storage device 2135, on the other hand, is a read-and-write memory device. This device is a non-volatile memory unit that stores instructions and data even when the electronic system 2100 is off. Some embodiments of the invention use a mass-storage device (such as a magnetic or optical disk and its corresponding disk drive) as the permanent storage device 2135.

Other embodiments use a removable storage device (such as a floppy disk, flash drive, etc.) as the permanent storage device. Like the permanent storage device 2135, the system memory 2125 is a read-and-write memory device. However, unlike storage device 2135, the system memory is a volatile read-and-write memory, such a random access memory. The system memory stores some of the instructions and data that the processor needs at runtime. In some embodiments, the invention's processes are stored in the system memory 2125, the permanent storage device 2135, and/or the read-only memory 2130. For example, the various memory units include instructions for processing multimedia clips in accordance with some embodiments. From these various memory units, the processing unit(s) 2110 retrieve instructions to execute and data to process in order to execute the processes of some embodiments.

The bus 2105 also connects to the input and output devices 2140 and 2145. The input devices enable the user to communicate information and select commands to the electronic system. The input devices 2140 include alphanumeric keyboards and pointing devices (also called "cursor control devices"). The output devices 2145 display images generated by the electronic system. The output devices include printers and display devices, such as cathode ray tubes (CRT) or liquid crystal displays (LCD). Some embodiments include devices such as a touchscreen that function as both input and output devices.

Finally, as shown in FIG. 21, bus 2105 also couples electronic system 2100 to a network 2165 through a network adapter (not shown). In this manner, the computer can be a part of a network of computers (such as a local area network ("LAN"), a wide area network ("WAN"), or an Intranet, or a network of networks, such as the Internet. Any or all components of electronic system 2100 may be used in conjunction with the invention.

Some embodiments include electronic components, such as microprocessors, storage and memory that store computer program instructions in a machine-readable or computer-readable medium (alternatively referred to as computer-readable storage media, machine-readable media, or machine-readable storage media). Some examples of such computer-readable media include RAM, ROM, read-only compact discs (CD-ROM), recordable compact discs (CD-R), rewritable compact discs (CD-RW), read-only digital versatile discs (e.g., DVD-ROM, dual-layer DVD-ROM), a variety of recordable/rewritable DVDs (e.g., DVD-RAM, DVD-RW, DVD+RW, etc.), flash memory (e.g., SD cards, mini-SD cards, micro-SD cards, etc.), magnetic and/or solid state hard drives, read-only and recordable Blu-Ray® discs, ultra density optical discs, any other optical or magnetic media, and floppy disks. The computer-readable media may store a computer program that is executable by at least one processing unit and includes sets of instructions for performing various operations. Examples of computer programs or computer code include machine code, such as is produced by a compiler, and files including higher-level code that are executed by a computer, an electronic component, or a microprocessor using an interpreter.

While the above discussion primarily refers to microprocessor or multi-core processors that execute software, some embodiments are performed by one or more integrated circuits, such as application specific integrated circuits (ASICs) or field programmable gate arrays (FPGAs). In some embodiments, such integrated circuits execute instructions that are stored on the circuit itself.

As used in this specification, the terms "computer", "server", "processor", and "memory" all refer to electronic or other technological devices. These terms exclude people or groups of people. For the purposes of the specification, the terms display or displaying means displaying on an electronic device. As used in this specification, the terms "computer readable medium," "computer readable media," and "machine readable medium" are entirely restricted to tangible, physical objects that store information in a form that is readable by a computer. These terms exclude any wireless signals, wired download signals, and any other ephemeral signals.

While the invention has been described with reference to numerous specific details, one of ordinary skill in the art will recognize that the invention can be embodied in other specific forms without departing from the spirit of the invention. For example, while the examples shown illustrate splitting one or more shapes of a design layout region into two exposures, one of ordinary skill in the art would recognize that some embodiments would use similar processes to split shapes of a design layout region into more than two (e.g., three, four, etc.) exposures. One of ordinary skill in the art will also recognize that in some instances above, when referring to assigning shapes or portions of shapes to multiple exposures, the shapes (or portions thereof) are actually assigned to multiple mask layouts that are used to create multiple masks that enable a design layout layer to be printed in multiple exposures. Similarly, one of ordinary skill would recognize that while many instances above refer to "drawing" a graph, some embodiments do not actually draw the visible graph, but instead define the graph as a data structure.

In addition, a number of the figures (including FIGS. 6, 9, 12, and 13) conceptually illustrate processes. The specific operations of these processes may not be performed in the exact order shown and described. The specific operations may not be performed in one continuous series of operations, and different specific operations may be performed in different embodiments. Furthermore, the process could be implemented using several sub-processes, or as part of a larger macro process. Thus, one of ordinary skill in the art would understand that the invention is not to be limited by the foregoing illustrative details.

What is claimed is:

1. A non-transitory machine readable medium storing a program for detecting design rule violations in a multi-layer circuit design layout including a plurality of shapes, the program comprising sets of instructions for:

identifying a plurality of disjoint sets of shapes that each comprises a number of shapes on one layout layer that are each within a threshold distance from at least one other shape in a same disjoint set of shapes, wherein no shape within a disjoint set is within the threshold distance of any shape in another disjoint set;

in each particular disjoint set of a group of disjoint sets, identifying at least one subset of shapes that forms a loop of shapes that includes at least three shapes and includes only shapes of the particular disjoint set that are each within a threshold distance from at least two other shapes in the particular disjoint set, wherein at least one particular loop of one identified particular subset wholly contains at least one shape that is not part of the identified particular subset;

examining different identified subsets of shapes to identify any identified subset that violates a design rule; and for each identified particular subset of shapes that violates a design rule, displaying a marker near the identified particular subset of shapes to visually aid a user to identify and resolve the design rule violation.

2. The non-transitory machine readable medium of claim 1, wherein the set of instructions for identifying the plurality of disjoint sets of shapes comprises a set of instructions for connecting with a link each pair of shapes in the plurality of shapes that are within the threshold distance.

3. The non-transitory machine readable medium of claim 1, wherein the threshold distance defines that two shapes within the threshold distance should be assigned to different mask layouts.

4. The non-transitory machine readable medium of claim 2, wherein the set of instructions for identifying the plurality of disjoint sets of shapes further comprises a set of instructions for identifying a set of shapes in which all shapes are connected to each other by one or more links and shapes.

5. The non-transitory machine readable medium of claim 4, wherein the set of instructions for examining different identified subsets of shapes to identify any identified subset that violates a design rule comprises sets of instructions for:

for each identified subset:
assigning shapes in the subset of shapes to two different mask layouts; and
determining whether the subset includes at least one pair of shapes connected by a link and assigned to a same mask layout.

6. The non-transitory machine readable medium of claim 5, wherein the set of instructions for determining whether each subset includes the at least one pair of shapes comprises a set of instructions for tracing a graph that is formed by the shapes in the disjoint set and links connecting the shapes.

7. The non-transitory machine readable medium of claim 6, wherein the set of instructions for tracing the graph comprises a set of instructions for using a breadth-first search.

8. The non-transitory machine readable medium of claim 2, wherein the set of instructions for examining different identified subsets of shapes to identify any identified subset that violates a design rule comprises a set of instructions for tracing a graph that is formed by the shapes in each subset and links connecting the shapes (1) to identify a pair of shapes in the subset of shapes that violate the design rule and (2) to identify one or more shapes in the subset of shapes that are not part of the loop.

9. The non-transitory machine readable medium of claim 8, wherein the set of instructions for tracing the graph comprises a set of instructions for using a breadth-first search.

10. The non-transitory machine readable medium of claim 4, wherein the set of instructions for identifying the plurality of disjoint sets further comprises sets of instructions for:

for each disjoint set of the plurality of disjoint sets:
assigning shapes in the disjoint set to two different mask layouts;
identifying all pairs of shapes in the disjoint set that are connected by a link and assigned to a same mask layout; and
identifying all subsets of shapes in the disjoint set that include at least one identified pair of shapes.

11. The non-transitory machine readable medium of claim 1, wherein the marker identifies all of the shapes in the subset of shapes that violates the design rule.

12. The non-transitory machine readable medium of claim 1, wherein the violated design rule is a double patterning rule violation.

13. The machine readable medium of claim 1, wherein at least a first identified subset that forms a first loop wholly contains a second identified subset that forms a second loop.

14. A system comprising:
a processor for executing sets of instructions; and
a memory for storing a computer program for correcting design rule violations in a multi-layer circuit design layout including a plurality of shapes, the program comprising sets of instructions for:
identifying a plurality of disjoint sets of shapes that each comprises a number of shapes on one layout layer that are each within a threshold distance from at least one other shape in the same disjoint set of shapes, wherein no shape within a disjoint set is within the threshold distance of any shape in another disjoint set;
in each particular disjoint set of a group of disjoint sets, identifying at least one subset of shapes that forms a loop of shapes that includes at least three shapes and includes only shapes of the particular disjoint set that are each within a threshold distance from at least two other shapes in the particular disjoint set, wherein at least one particular loop of one identified particular subset wholly contains at least one shape that is not part of the identified particular subset;
examining different identified subsets of shapes to identify any identified subset that violates a design rule; and
for each identified particular subset of shapes that violates a design rule, displaying a marker near the identified particular subset of shapes to visually aid a user to identify and resolve the design rule violation.

15. The system of claim 14, wherein the set of instructions for examining different identified subsets comprises a set of instructions for assigning shapes in the subset to two different mask layouts.

16. The system of claim 15, wherein the set of instructions for examining different identified subsets further comprises a set of instructions for determining whether the subset includes at least one pair of shapes that are (i) within the threshold distance and (ii) assigned to a same mask layout.

17. A computer-implemented method for detecting design rule violations in a multi-layer circuit design layout including a plurality of shapes, the method comprising:
identifying a plurality of disjoint sets of shapes that each comprises a number of shapes on one layout layer that are each within a threshold distance from at least one other shape in the same disjoint set of shapes, wherein no shape within a disjoint set is within the threshold distance of any shape in another disjoint set;
in each particular disjoint set of a group of disjoint sets, identifying at least one subset of shapes that forms a loop of shapes that includes at least three shapes and includes only shapes of the particular disjoint set that are each within a threshold distance from at least two other shapes in the particular disjoint set, wherein at least one particular loop of one identified particular subset wholly contains at least one shape that is not part of the identified particular subset;

examining different identified subsets of shapes to identify any identified subset that violates a design rule; and for each identified particular subset of shapes that violates a design rule, displaying, at a computer, a marker near the identified particular subset of shapes to visually aid a user to identify and resolve the design rule violation.

18. The method of claim 17, wherein examining different identified subsets of shapes comprises assigning shapes in the different identified subsets to two different mask layouts.

19. The method of claim 18, wherein examining different identified subsets of shapes further comprises identifying all pairs of shapes in the disjoint set that are assigned to a same mask layout.

* * * * *